(12) United States Patent
Lambeth

(10) Patent No.: US 7,128,988 B2
(45) Date of Patent: Oct. 31, 2006

(54) MAGNETIC MATERIAL STRUCTURES, DEVICES AND METHODS

(75) Inventor: David N. Lambeth, Pittsburgh, PA (US)

(73) Assignee: Lambeth Systems, Pittsburgh, PA (US)

( * ) Notice: Subject to any disclaimer, the term of this patent is extended or adjusted under 35 U.S.C. 154(b) by 325 days.

(21) Appl. No.: 10/415,757

(22) PCT Filed: Aug. 29, 2002

(86) PCT No.: PCT/US02/27327

§ 371 (c)(1),
(2), (4) Date: Aug. 29, 2003

(87) PCT Pub. No.: WO03/021579

PCT Pub. Date: Mar. 13, 2003

(65) Prior Publication Data

US 2004/0058196 A1    Mar. 25, 2004

(51) Int. Cl.
*G11B 5/66* (2006.01)
*G11B 5/70* (2006.01)

(52) U.S. Cl. .................................. 428/831.2
(58) Field of Classification Search ............ 428/828, 428/831.2, 832, 815
See application file for complete search history.

(56) References Cited

U.S. PATENT DOCUMENTS

| | | | |
|---|---|---|---|
| 6,097,579 A | 8/2000 | Gill | 360/324.2 |
| 6,146,776 A | 11/2000 | Fukuzawa et al. | 428/692 |
| 6,248,416 B1 | 6/2001 | Lambeth et al. | 428/65.3 |
| 6,262,869 B1 | 7/2001 | Lin et al. | 360/324.11 |

FOREIGN PATENT DOCUMENTS

JP    408204253 A    8/1996

OTHER PUBLICATIONS

PCT/US98/23855 filed Nov. 9, 1998.

*Primary Examiner*—Holly Rickman
(74) *Attorney, Agent, or Firm*—Armstrong, Kratz, Quintos, Hanson & Brooks, LLP

(57) ABSTRACT

A thin film magnetic structure, magnetic devices, and method of producing the same, wherein (110) textured, symmetry broken body centered cubic or body centered cubic derivative crystalline structures epitaxially grown on hexagonal shaped templates, in the presence of a symmetry breaking mechanism is provided to promote oriented uniaxial magnetic properties from a series of successively deposited film layers, result in new oriented magnetic layer structures and microstructures and thus improved magnetic devices and device performance.

41 Claims, 15 Drawing Sheets

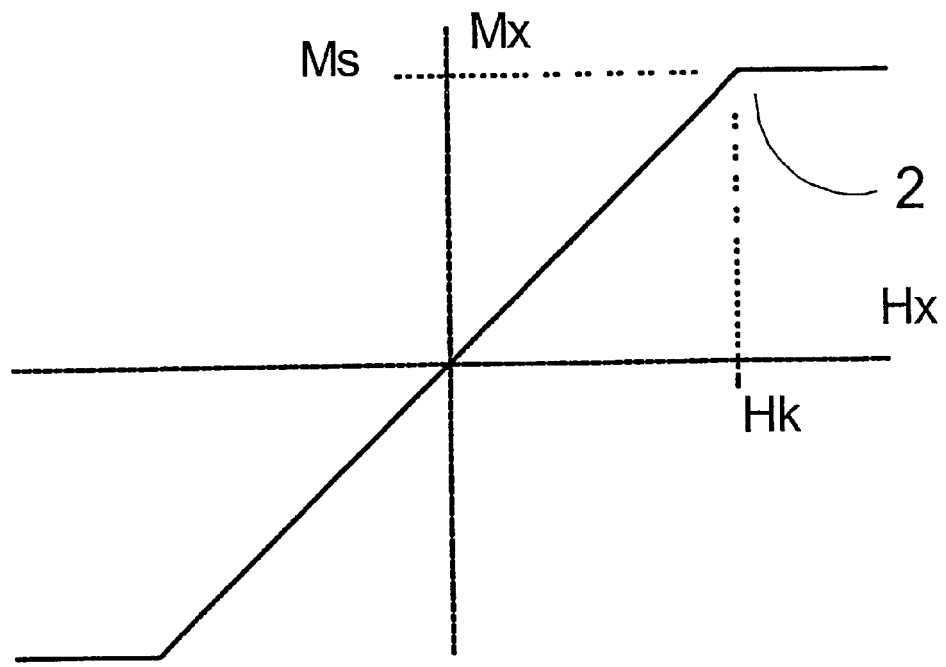
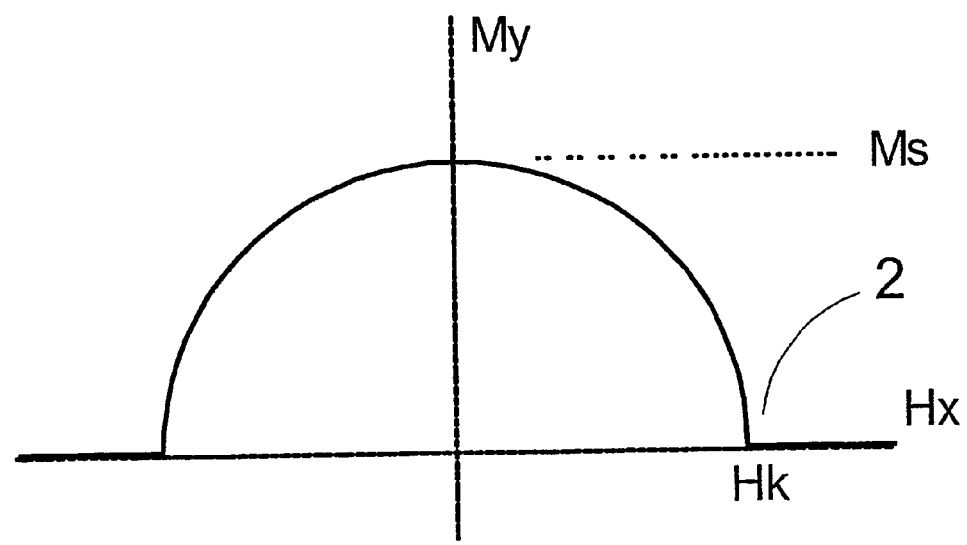
Figure 2
PRIOR ART

MAGNETIC MATERIAL STRUCTURES, DEVICES AND METHODS

BACKGROUND OF THE INVENTION

1. Field of the Invention

This invention is directed to magnetic material structures, methods for making magnetic material structures and devices made from magnetic material structures.

2. Description of the Prior Art

As the home, office, transportation system, business place and factory become more automated and electronically connected, and as electronic devices and appliances such as computers, communication devices, wireless communication devices, electronic games, entertainment systems, personal data assistants, transportation vehicles, manufacturing tools, shop tools, and home appliances become more sophisticated there is, and will be, an ever-increasing demand for higher performance and low cost electronic circuits, sensors, transducers, data storage systems and other magnetic devices which employ magnetic thin film materials. In order for these devices to remain competitive in the market place each product generation must be higher performing, unobtrusive and, usually, less expensive than the previous. Hence there are ever increasing demands for technical improvements in the materials and structure of these devices.

For all of these applications the magnetic material has an improved performance if the magnetic properties can be better controlled during the construction. Two familiar properties, which are sometimes considered to be intrinsic magnetic properties, are the saturation magnetization, Ms, and the magnetocrystalline anisotropy energy density constants (usually denoted by a subscripted K symbol). The meaning of magnetic anisotropy energy is that the magnetization would have a preferred direction, or directions, of orientation. That is, the energy of the system is minimal when the magnetization vector points along certain directions. These directions are referred to as the magnetic easy axes while the magnetic hard axes coincide with magnetic orientations where the energy is maximized. However, it should be noted that the magnetic anisotropy is not actually an intrinsic property in the sense that the materials are commonly not made perfectly. Nevertheless, good performance in device applications is almost always dependent upon there being a single preferred magnetic orientation or anisotropy direction and so in the manufacturing process one strives to achieve a desired uniaxial anisotropy. An objective of the present invention is to provide new mechanisms for controlling the magnetocrystalline anisotropy of thin magnetic films. By doing so the performance of almost all magnetic devices are envisioned to be improved.

In general the anisotropy energy is a function of the orientation of the magnetization vector with respect to a given physical axis. Here, we define a "uniaxial" anisotropy to exist if the anisotropy energy density function only contains a single maximum and a single minimum as the magnetization angle, $\theta$, is rotated by 180 degrees from a physical axis. Likewise we define an "ideal uniaxial" anisotropy energy to exist if the energy equation has only a $\sin^2(\theta)$ or $\cos^2(\theta)$ dependence. Materials and device processing to achieve a desired orientation or anisotropy is commonly difficult and sometimes impossible, perhaps because heretofore the mechanism for achieving anisotropic orientation has not been well understood. Furthermore, uniform control of the orientation of the magnetic anisotropy is often difficult to achieve and maintain in a manufacturing process where many different desired material properties must be obtained simultaneously.

Background for Oriented Soft Magnetic Films

In magnetic devices, for example, such as sensors, transducers, transformers, inductors, signal mixers, flux concentrators, recording media keepers, data recording and playback transducers it is common that the magnetic response to a driving field possess high sensitivity and at the same time, low coercivity (Hc). Or stated simply, the material possesses essentially non-hysteretic behavior. For this type of behavior the device is constructed so that the applied field is directed along the hard magnetic axis of a uniaxial magnetic material. This results in the minimization of coercivity and hysteric effects, which are many times associated with magnetic domain wall motion of materials that are multi-axial. For example, a material, which has bi-axial anisotropy, will have two easy and two hard magnetic axes and will exhibit hystersis and losses. In many of these applications a linear, or near linear response is also advantageous, while in other applications, such as signal mixers, a controlled non-linear response is desire. To obtain a linear magnetic response, requires both applying a field along the magnetic hard axis and that the anisotropy energy density function not only be uniaxial, but that it also have simple $\sin^2(\theta)$ or negative $\cos^2(\theta)$ dependence, where, $\theta$, is the angle measured between the magnetization vector direction and the physically determined magnetic easy axis. Since there is the mathematical identity, $\sin^2(\theta)=1-\cos^2(\theta)$, and since the origin in the energy function is arbitrarily defined the use of $\sin^2(\theta)$ or $-\cos^2(\theta)$ yield equivalent physical behavior. Item [1] of FIG. 1 illustrates the squared sinusoidal anisotropy energy density curve shape versus the angle of the magnetization vector with respect to the easy axis located at zero degrees. FIG. 2 illustrates the response of the components of the magnetization, $M_x$ and $M_y$, as a function of applied field, $H_x=H_a$, along the hard magnetic axis direction, x. The linear curve kinks only at the point [2] where the magnetization becomes saturated, or fully aligned with the applied field. For this special uniaxial anisotropy this occurs at the applied field value of $H_k$ along the x direction, which is known as the anisotropy field. These response curves are sometimes referred to as hysteresis loops even though they exhibit no hysteresis. It is the shape of the $\sin^2(\theta)$ energy function that causes the response, $M_x$, along the hard axis to be linear and to be fully reversible. $M_y$ is the response in the y direction to an applied field in the x direction. The curve shape shown is quadratic for applied field magnitudes less than $H_k$, where $M_y$ is zero for larger magnitude fields. The quadratic behavior is necessary for linear $M_x$ since $M_s^2=M_x^2+M_y^2$, where $M_s$ is the total, constant, saturation magnetization vector magnitude. If the anisotropy energy is uniaxial, but is not governed by the, ideal, $\sin^2(\theta)$ functional form then the magnetic response is not linear. However, heretofore, the applicant knows of no real material examples exhibiting both a uniaxial energy curve and a non-linear $M_x$ versus $H_x$ behavior.

Materials exhibiting the $\sin^2(\theta)$ energy density functional form are often referred to as having Stoner-Wohlfarth behavior after the famous ideal uniaxial single domain magnetization theory. However, thin films are commonly multi-domain even though they might exhibit the $\sin^2(\theta)$ functional energy form on a localized basis. Unless the hard axis direction is the same at all points in a sample and the applied driving field is exactly parallel to the hard axis then domain wall motion can commonly be observed. This motion results in coercivity mechanisms and hysteretic energy losses. The lossless behavior of samples represented by FIG. 2 is due to the magnetization rotating in response to the applied field rather than a response via domain wall motion. Multi-axis anisotropy materials always switch via wall motion and so suffer losses.

It is also well known that, for soft uniaxial thin films, by first applying a field along the easy axis, and then by keeping a constant bias field in this direction, to eliminate 180 degree domain walls, one can force all of the material to appear to be single domain as the hard axis is then driven. Hence, because of this bias field, $H_b=H_y$, in the easy axis direction the application of any finite $H_x$ field along the hard axis can never quite drive the magnetization vector completely to the energy maximum [3] and the response will always be reversible and so lossless. This is not the case for materials with multiple anisotropy axes. For uniaxial materials the rotational response is key to many sensor devices and it is common in various forms of magnetoresistive sensors to provide a bias field along the easy axis by either applying a small field or by exchange coupling the magnetic sensor material to a hard magnetic material that has been so oriented to provide an effective bias field.

For some sensor applications, such as anti-theft devices, and special electronic mixing circuit devices, soft, low loss, magnetic properties are desired simultaneously with a specific non-linear response. In these applications, the driving field has historically, and most commonly, been directed along an easy axis or in the direction of the lowest magnetic anisotropy energy. In this direction magnetic domain wall motion is usually significant. This domain wall motion commonly results in a highly non-linear response or even in strong hysteretic behavior.

Certain anti-theft, article surveillance, article identification or inventory control devices rely upon detecting harmonic signals, which are generated by this non-linear behavior or upon materials being driven in to saturation. One of many examples, of this type of surveillance system and tag is described in U.S. Pat. No. 3,747,086. This type of tag response has also been disclosed as enabling multiple bits of information to identify objects in U.S. Pat. No. 5,538,803 Other article tag devices are based upon the magnetoelastic effect and mechanical resonance, where coupling exist between the magnetization and the mechanical strain in the material. An example, of this type of tag is disclosed in U.S. Pat. No. 4,510,489. In these later devices it is desirable to drive the magnetization towards a hard axis so that rotation of the magnetization dominates and magnetic hysteretic losses are minimized. By using this mode, and by using the field to drive the device at its mechanical resonance frequency significant amounts of energy can be stored in the device. Hence, even after the drive field has been removed the mechanical vibration continues, the magnetoelastic properties are then used to invert the process to transmit a magnetic field as the mechanical stress causes the magnetization vector direction to rotationally oscillate synchronously with the mechanical vibration. This time dependent magnetic dipole radiates a magnetic field at the distinct resonance frequency, which can be detected to verify the tag's existence. Uniaxial anisotropy is needed in such a device to achieve low losses. Due to the magnetoelastic coupling between the mechanical strain and the magnetic moment orientation the fundamental of the mechanical resonance frequency is emitted as an oscillating magnetic dipole field. However, if the uniaxial anisotropy is non-ideal and results in a non-linear response then the harmonics would also be available for detection in the presence of a drive signal. This is advantageous, but there have never been available materials from which to form such a device before.

Likewise, in analog mixer circuit devices a non-linear response is desired. When two separate sinusoidal signals are simultaneously imposed on a nonlinear circuit device component a multiplication process results in a beating of the two signals. This results in additional harmonics at the sum and difference frequencies of the initial signals. Hence, the information contained in a modulated carrier frequency signal can be shifted to a beat frequency. Typically this is done to shift the information carrying bandwidth to a higher carrier frequency bandwidth (modulation) or bring the information carrying bandwidth signal back down to a bandwidth located near, or nearer to, zero frequency for demodulation. These techniques of frequency shifting are common to telecommunication and signal processing and in many other signal processing applications. The non-linear circuit response, circuit components, and circuit implementation used to perform these signal mixing processes are described in many electrical engineering circuit textbooks. Two example texts are "Electronic Communications Techniques" by P. H. Young and "Physics of Semiconductor Devices" by S. M. Sze. Ideally the non-linear device used to mix the signals is efficient, low loss, and low noise. Usually non-linear Silicon active devices are used for this. In the past when magnetic devices were used for this application domain wall motion caused both losses to the signal and induced noise. A magnetic material with non-linear response that operates by low loss magnetization rotation rather than by domain wall motion is very desirable.

For most all transducer and sensor applications, which require low anisotropy values in order to provide large sensitivity, the use of cubic crystalline materials are common. However, due to the three fold crystalline symmetry of cubic materials, achieving a single axis of anisotropy energy density, which is almost always essential to obtaining the desired low loss, low noise, magnetic properties, is difficult. Thin, or thick, film materials are commonly employed. For example many devices, such as data storage playback transducers or field transducers, commonly utilize face centered cubic, fcc, thin film crystalline materials. Should these materials be prepared with a (001) crystalline texture the anisotropy energy, as a function of angle in the film plane is bi-axial, has multiple easy and hard axes in the film plane yielding a non-linear and hysteretic magnetic response resulting in noisy signals. Hence, a (111) crystalline texture is desired, where it can be mathematically shown for the case of the magnetization being confined to the (111) texture plane, that due to the crystalline three fold symmetry of the projection of the {111} crystalline directions into the film plane, the cubic material will possess no net first order anisotropy energy density. Even for only moderate saturation magnetization thin films, the magnetization is essentially confined to the film plane by the demagnetization forces associated with the planar film shape.

To achieve a single uniaxial anisotropy in a cubic material with (111) texture the material is usually subjected to a thermal treatment, or is deposited directly, in the presence of an applied magnetic field. The resulting single magnetic easy axis is aligned along the applied magnetic field, while the hard axis is perpendicular to this applied field. Furthermore the $M_x$ versus $H_x$ response function is a linear response. While the mechanism for the cause of this induced magnetic anisotropy is not well understood it is often argued that an atomic pair ordering mechanism occurs to break the symmetry of the directions in the (111) plane for each grain of the material. That is, on a local scale inside each grain, pairs of atoms align along the applied field during the deposition, or the annealing process, to reduce the magnetic field energy. Interestingly, annealing in a field of different orientation can often alter this induced anisotropy direction demonstrating that the orientation inducing mechanism is reversible. It is believed that this localized ordering allows fcc materials such as the NiFe alloys, permalloy, to have a small induced uniaxial anisotropy. Magnetic thin film body centered cubic, bcc, or bcc derivative materials, such as Fe, FeCo, FeAl, and similar compositions, are seldom used in such applications because the required (111) crystalline texture never develops during deposition of the bcc symmetric crystals.

It is well understood that during the growth of thin metal films certain texture orientations tend to appear. These are driven by the minimization of surface energy and surface bonding considerations and are modified by surface mobility issues, which can be somewhat controlled by substrate and processing conditions. One simple rule of thumb is that the film surface energy is minimized when the atomic surface configuration is the most closely packed. For a fcc crystal the atoms in the surface are most closely packed in the (111) plane and so this texture is the most likely. The (001) texture is less energetically likely, but is possible where as the high surface energy (110) texture never seems to occur. On the other hand, for a bcc crystal the atomic surface most closely packed is the (110) texture and this commonly appears, the (001) texture is the next lowest energy and is sometimes induced, but the high surface energy (111) texture never seems to occur. Hence, for fcc crystals we refer to the (111) texture as being natural where as for the bcc crystal we refer to the (110) texture as being naturally occurring. If a low surface energy substrate is chosen, such as an amorphous metal, which tends to wet to the depositing material, the fcc (111) texture and the bcc (110) texture naturally occur. On the other hand, if the substrate is non-wetting, such as an oxidized surface where the depositing material tends to bond to the oxygen atoms to limit the atomic surface mobility, then it is common to see limited orientation in the deposited films or at best a set of mixed textures. The fcc crystal tends to form only weak (111) and (001)textures while the bcc crystal tends to form only weak (110) and (001) textures. For magnetic cubic crystalline thin film grains with (110) or (001) texture there are multiple easy or hard axes in the film plane of the grain. In addition, because each grain has a random in-plane orientation relative to other grains, these polycrystalline magnetic materials result in an ensemble of grains with multiple, random, anisotropy axes. These materials yield both a non-linear response, as well as, high coercivity associated with losses and noise. Hence, bcc or bcc derivative materials, which almost always grow with (110) or (001) texture, are seldom used for devices. For this reason the high saturation magnetization value of bcc materials have largely been unavailable to the device designer who wishes to avoid domain wall motion.

One need only consult the very authoritative text, "Physics of Ferromagnetism, $2^{nd}$ Edition" by Soshin Chikazumi, pages 299–309, on thermally induced anisotropy of permalloy to see that the degree of understanding of the cause of uniaxial anisotropy in cubic materials is poor. Professor Chikazumi details the literature on the subject and notes that one theory attempts to explain this "phenomena in terms of "directional order," or an anisotropic distribution of different atomic pairs such as Ni—Ni, Fe—Fe, or Ni—Fe." The logic is that the atomic spacing between the Ni—Fe pair is smaller than the other possible pairs and so a lattice distortion results from the atomic pairing. A magneto-crystalline uniaxial anisotropy is then proposed to result from the magneto-elastic energy associated with the resulting lattice distortion. Professor Chiakazumi also outlines a second theory in which it is "assumed that ordering occurred by the growth of distinct volumes of the ordered phase, and explains the induced anisotropy as the result of shape anisotropy of the second phase." Geometrical grain shapes, other than spherical, could generate considerable shape anisotropy energy. It should be pointed out however, that no physical evidence supporting either of these theories has been provided.

Shape anisotropy is an intellectually comforting explanation, as this phenomenon is quite observable in elongated magnetic particles such as used in magnetic particulate data storage tapes and bar shaped permanent magnets. In these, the magnetic easy axis is aligned with the longer dimension. However, while Professor Chiakazumi illustrates that a rather complex pair ordering model with dipole-dipole interactions proposed by Neel can be used to qualitatively explain field induced anisotropy, there is no quantitative agreement and he comments "The reasons why quantitative agreement is not obtained may lie in the approximate estimates of various quantities and in failure to attain complete thermal equilibrium." Nevertheless, he comments regarding the texture of the materials that "magnetic annealing is most effective for, <111> annealing, less effective for <110>, and least effective for <100>." In this statement he is referring to the parallel orientation of the applied field and the crystalline directions during the annealing process.

Very recently a publication; "Soft High Saturation Magnetization $(Fe_{0.7}Co_{0.3})_{1-x}N_x$ Thin Films For Inductive Write Heads," IEEE Transactions On Magnetics, Vol. 36, No. 5, September 2000, by N. X. Sun and S. X. Wang, claimed to achieve orientation of the bcc like material during deposition in an applied magnetic field. The publication appears to indicate that the Nitrogen content was necessary, induced strain into the films, and created a small grain structure as it shifted the angle of, and broadened, the (110) x-ray diffraction peak. They also indicated that a "significant amount" of a second crystalline magnetic phase, $Fe_4N$, appeared in the films. As Chikazumi suggests perhaps this anisotropy behavior is due to the strain or shape or pair ordering associated with the second phase. It is interesting to note that they obtained this orientation on an oxidized Si (100) textured substrate and by the applicant's standards the FeCoN (110) texture is weak. They went on to indicate that by sandwiching the FeCoN film between two permalloy films the hard axis coercivity could be decreased, but they did not indicate or offer any evidence that the orientation of the FeCoN film was improved by depositing upon the permalloy. In fact, a comparison of hard axis hystersis loops for films prepared with and without the permalloy films indicate similar anisotropy fields necessary to saturate the magnetization. This would indicate that the permalloy layer did not improve the orientation in their structure.

Background for Orientation with Hard Magnetic Films

It should be noted that unlike field sensing and energy transforming devices that usually require soft magnetic materials, devices such as magnetic recording media and permanent magnets demand higher uniaxial anisotropy energy in order to achieve high coercivity Hc, and a preferred orientation in order to achieve a high remnance value. For motors or actuators this directly affects the amount of work that a device can deliver while for recording media it directly affects the output signal level and signal pulse width, or flux transition width, and, hence, the recording density. Even in some of these hard magnet applications it is desirable to incorporate soft magnetic materials to enhance overall performance. For example, perpendicular thin film recording media has long been discussed as a future replacement for longitudinal thin film media. However, in order for a recording system to function properly it is desirable that a soft magnetic keeper layer, or underlayer, be placed on the opposite side of the perpendicular hard magnetic recording layer from the recording head. This soft layer then provides a flux return path, or flux concentrator, for the recording head fields, as well as, a flux closure path for stabilizing the recorded bits against demagnetization energies after the head is removed. The former enables recording heads to function with higher coercivity media and with better resolution, while the later provides improved stability to the recorded patterns by eliminating a portion of the self-demagnetization energy associated with perpendicular recording. In longitudinal recording media a soft magnetic layer would also improve the stability of the recorded patterns by reducing the self-demagnetization energy of the hard recording layer. However, heretofore, no soft magnetic underlayer has been found to be a satisfactory keeper layer for either perpendicular or longitudinal media as no good method of controlled the anisotropy orientation has been available. Soft magnetic underlayers, without a uniform and controlled anisotropy direction, results in domain wall induced media noise via domain wall motion Barkhausen phenomena. As the magnetic head passes over the media data it effectively shorts out the stray media bit fringe fields causing the magnetic patterns in the soft magnetic underlayers to relax to new positions. If there are significant domain walls involved in this process they commonly break loose from localized pinning defects causing sudden changes in their magnetic configuration. This Barkhausen phenomena causes noise signals to appear in the data playback head. For either perpendicular or longitudinal hard disk recording, where the recorded bit or flux patterns have been wider across the recorded track than the bit length, the desired anisotropy configuration for the soft layer is for the hard magnetic axis to be along the recorded track so that the easy axis lies across the track direction. Hence, for a traditional hard disk system this implies that the easy axis of the soft film should be directed radially, while the hard axis is directed circumferentially. Since the easy axis of the soft magnetic layer of this configuration is at 90 degrees to the fields produced by the flux transitions of the hard recording layer, the magnetization vector of the soft magnetic layer rotates by spin rotation and the noise generating domain wall motion is avoided. Having a uniaxial soft magnetic underlayer with radial orientation will solve a long-standing technical problem. As data storage areal densities are pushed forward, magnetic grain sizes have been reduced to the extent that the magnetic recorded state is near the thermal stability limit. Hence, even longitudinal recording stability and the transition length also benefit from the use of a soft magnetic underlayer to reduce the bit transition demagnetizing effects. Again, because of domain wall motion generates noise the ideal orientation of the soft underlayer easy axis should be radial to minimize the potential for domain wall noise. Similarly, anisotropy orientation control can benefit magnetic tape and x-y addressable data storage systems by providing a keeper layer wherein the magnetization vector is rotated by spin rotation and domain wall motion is minimized. This invention, of oriented soft magnetic materials, represents a significantly improving future magnetic media.

Background for Hard Magnetic Film Orientation

Modern hard disk longitudinal media consists of a polycrystalline thin film composed essentially of uniaxial grains randomly oriented in the substrate plane. Playback by averaging the signals from the randomly oriented grains results in an isotropic response around the disk radius. This orientation randomness has been necessary to avoid the twice around modulation during disk rotation of a non-isotropic media. By mechanically grooving the disk surface prior to deposition of the thin film layers some small amount of orientation along the circumferential direction is sometimes observed. However, the orientation ratio, OR, of the hard magnetic remanence along the track to the radial remanence is seldom more than 1.2 and more often typically less than 1.1 and has been decreasing as substrates have been made smoother and media films made thinner to enable higher areal recording densities. Likewise, the ratio of the coercivities in the two directions is also sometimes referred to as the orientation ratio, OR, and its maximum value is also typically similar to that of the magnetic remanence ratios. The origin of this hard magnetic material orientation has been in dispute for several years. While it has been argued by some that it originates from a slight preference of the c-axis of the hexagonal close packed, hcp, cobalt alloy to lie along the grooved direction, it has also been shown to diminish or vanish if the disk is thermally cycled before media deposition, but after the mechanical grooving. This latter phenomenon has resulted in some arguing that the orientational origin is due to a thermal stress development between the substrate and the film layers as the substrate stress associated with the grooves relaxes from the heat used, or generated, during the deposition. In U.S. Pat. No. 5,989,674, Marinero et al. outlines several patents and publications claiming to reveal the cause of media orientation and then invokes stress, shape and even crystalline orientation to claim a cause for orientation during the deposition of an hcp cobalt alloy on a mechanically grooved substrate. Others had claimed to achieve small orientation ratios by deposition of the media materials at an oblique angle to the disk surface. See for example, U.S. Pat. No. 4,776,938. While this approach has shown some effect it has not resulted in a significantly improved OR over grooved substrates and the deposition methods described are significantly inefficient in the deposition of material. Furthermore, the crystallographic origin of this orientation effect has also never been clearly stated or proven and it is possible that it is due to particle shape effects. In spite of it's the patent description a number of years ago the method is not a technology that is currently used in production.

Nevertheless, from wherever the orientation originates, it has been proven to be beneficial to magnetic recording for achieving higher resolution and shorter magnetic flux transition lengths and better thermal stability. There is little doubt that a greater degree of this orientation is of benefit to future hard disk data storage systems. Likewise, in particulate tape the individual acicular magnetic particles are commonly oriented physically during the wet coating process to have their long axis, and hence their easy magnetic axes, to lie along the track direction. This results in a higher signal level, shorter transition length, and higher recording densities. It is an interesting observation, that for best performance, the easy axis orientation of the hard magnetic media layer, whether longitudinal or perpendicular media, should be along the applied head field direction, while the easy axis orientation of an associated soft keeper layer should be across the recording track, perpendicular to the applied head field direction for longitudinal media; in order to enjoy the benefits of magnetic moment rotation instead of domain wall motion to avoid the Barkhausen noise phenomena of the soft keeper layer.

Background for Epitaxial Thin Film Growth

One of the most often sited concepts is that thin films prefer to grow with the atoms arranged on the thin film surface to minimize the atomic bonding energy. This implies that the most stable atomic crystalline surface grows when the surface atoms form the densest arrangement consistent with the crystalline structure. This means that for the fcc lattice, and fcc derivatives, the (111) texture develops in a thin film because the atoms are the most closely packed on this crystalline plane. The next most commonly occurring texture would be the (001) while the (110) texture would be seen only rarely. On the other hand for the bcc, and bcc derivatives, the (110) texture preferentially develops, as it is the most closely packed crystalline plane. The next most commonly occurring texture is the (001), while the (111) texture is never observed. In rare instances, such as described in U.S. Pat. No. 5,693,426 it was found that for some materials the B2, bcc derivative, crystalline structure may form a (112) texture if deposited under the correct conditions. However, even the B2 crystal will easily form the (110) texture on non-oxidized surfaces, where the initially deposited atoms have high surface mobility during the film growth. Likewise, for hexagonal close packed (hcp) crystals the (0002) texture is the most closely packed and most commonly develops.

Likewise, there are several publications describing the epitaxial relationships, which prevail when a second crystalline material is deposited directly upon an underlayer. U.S. Pat. No. 6,248,416 discusses a number of these. Assuming that the atomic lattice spacing of the first material and the second material sufficiently match a number of second layer texture following relationships to the first layer texture have been found. However, if the atomic lattice matching is not sufficient then epitaxial growth does not occur. For example, U.S. Pat. No. 6,248,416, which is incorporated herein by reference, Lambeth et al. have discussed, non-ferromagnetic, Cr textures grown as quasi-epitaxial single crystal thin films on clean, non-oxidized, single crystal Si substrates.

The textures developed on these substrates are extremely strong indicating a high degree of order and single orientation. In this patent, and in other publications, it has been shown that two different fcc materials can epitaxially grow upon each other with the same texture. Likewise, two different bcc materials can epitaxially grow upon each other with the same texture. Likewise, two different hcp materials can epitaxially grow upon each other with the same texture. More interesting, however, is the case when one crystalline material class is deposited upon a different crystalline material class. Not only is crystalline texture induced into the second layer by the epitaxial growth on the first layer, the texture, and the in-plane orientation of the second layer is determined by the first layer texture and orientation. For example, U.S. Pat. No. 6,248,416 shows that a clean Si (001) single crystal can induce fcc Ag (001) texture and if bcc Cr is grown on this then (001) texture results. The authors then showed that hcp Co (11$\bar{2}$0) texture grows on the Cr (001) texture and that the possible c-axes orientations is predetermined, to be only two possible directions, by the crystalline directions of the single crystal Si wafer. Likewise, they showed that if a Si (110) textured single crystal is used as the substrate then the highly unusual fcc Ag (110) texture develops and on this, the unusual bcc Cr (112) texture, develops. Co (10$\bar{1}$0) texture is induced by this Cr surface and the in-plane single Co c-axis lies parallel to the Cr <110> direction. Another epitaxial texture relationship described in U.S. Pat. No. 6,248,416 is noted. If the initial single crystal Si substrate is (111) the epitaxial fcc Ag will be (111) textured and oriented in the plane in the same directions as the Si crystal. If another fcc, such as Cu or Ni, is deposited upon this then it too will be epitaxial and so carry the (111) texture and orientation. Each of these textures is strongly oriented because the layer below it is strongly oriented and one can continue the epitaxial growth of one layer on the next. They also described how this structure, with the use of a Ti layer can be used to grow hard magnetic perpendicular Co (0002) texture films. They did not describe how Cr would grow on these (111) texture fcc layers or the Co (0002) textured layer. Nevertheless in separate publications H. Gong et al, (H. Gong, W. Yang, M. Rao, D. E. Laughlin and D. N. Lambeth, "Epitaxial growth of quad-crystal Co-alloy magnetic recording media," *IEEE Transactions on Magnetics*, 35(5), 1999, pp. 2676–2663), as well as, G. Zangari et al (G. Zangari, B. Lu, D. E. Laughlin and D. N. Lambeth, "Structure and Magnetic Properties of Sm—Co Thin Films on Cr/Ag/Si Templates," *Journal of Applied Physics*, Vol. 85 (8), Apr. 15, 1999, pp. 5759–5761 ), noted that upon the (111) single crystal Si substrate and subsequent epitaxial (111) textured fcc layers when a bcc Cr was deposited a strong Cr (110) texture resulted. However, the atomic arrangement of the (110) bcc crystalline plane is rectangular while the fcc atomic arrangement of the (111) crystalline plane has hexagonal symmetry. Gong et al notes, as does Zangari et al, that there are three possible ways (variants) for the bcc Cr (110) plane to orient on this atomic hexagonally arrange surface. These crystalline planes and crystalline directions are illustrated in FIG. 3. These three orientations correspond to when the <001> directions of the (110) textured Cr lie exactly parallel to the <110>, or perpendicular to the <112>, directions of the hexagonal atomic lattice plane of the (111) textured fcc. They summarized these three Cr (110) orientational variant relationships with the fcc underlayer via the following notation:

Cr (110) [001] ∥ Ag (111) [1$\bar{1}$0] ∥ Si (111) [1$\bar{1}$0],
Cr (110) [001] ∥ Ag (111) [10$\bar{1}$] ∥ Si (111) [10$\bar{1}$],
Cr (110) [001] ∥ Ag (111) [01$\bar{1}$] ∥ Si (111) [01$\bar{1}$].

Their publications, as well as U.S. Pat. No. 6,248,416, were focused upon hard hcp and soft fcc magnetic structures that could be grown and they show no evidence of working with anything but non-magnetic bcc materials such as Cr. Upon each of these three Cr variants four possible hcp Co (10$\bar{1}$1) quad-crystal variants were obtained. This Co layer then contains grains with four possible easy axes directions when grown on each Cr variant. As a result, the Co quad-crystal structure consists of grains, each with one of twelve possible easy axis directions. There are four Co orientational possibilities for each of the three possible Cr variants.

FIG. 3 illustrates the positions of the three bcc Cr (110) orientational variants [4] relative to the fcc (111) epitaxial template [5]. Example <001> bcc directions and an example <112> fcc direction are shown along with other relevant crystallographic directions. Hence, the public literature, states that there are three possible Cr variants that can grow on the (111) fcc textured substrate. The same result would apply to any size single crystal provided it is (111) textured fcc and the lattice constants are sufficiently matched to induce the epitaxial growth. Hence, since polycrystalline fcc films, grown on a non-single crystal substrate, with strong (111) texture, contain a large number of single crystal grains, one could obtain the same result for each individual grain. However, if the grain were small enough, it is possible that only one or two of the three possible bcc (110) textured orientational variants might grow on a given grain, but it is also possible, depending upon the deposition processing conditions, that all three variants could coexist on a single fcc (111) textured grain. Furthermore, since the probability of growth for each variant is equal then a sufficiently large sample will contain an equal volume of each variant and a magnetic material will appear to have symmetrical orientational magnetic properties. This would be true if the epitaxial growth occurred on a single crystal substrate or if the final film were polycrystalline and had been grown on a non-single crystal substrate.

These effect will now be explained in terms of the anisotropy energy density.

Magnetic Anisotropy Energy of (110) Textured Thin Films

To understand the magnetic properties of (110) textured magnetic bcc materials grown on a (111) texture fcc substate we consider the expression for the cubic magnetocrystalline anisotropy energy when the magnetization is confined to the thin film plane of a single crystal of cubic material. Consider the in-plane unit cell atomic surface [6] of a single variant of the (110) textured film grown in FIG. 3. FIG. 4 shows the magnetocrysalline energy plotted, where the magnetization is confined to the (110) crystalline plane, as a function of angle for this single variant for $K_1>0$ and $K_2=0$. The magnetocrystalline energy density is given by $E_{110}(\theta)$ (See "Physics of Ferromagnetism, $2^{nd}$ Edition" by Soshin Chikazumi, pages 249–256), where:

$$E_{110}(\theta) = K_1\{(1/4)\sin^4(\theta) + \sin^2(\theta)\cos^2(\theta)\} + K_2\{(1/4)\sin^4(\theta)\cos^2(\theta)\} + \text{higher } K \text{ terms.}$$

Or when expanded into the harmonics of θ, $$E_{110}(\theta) = (1/32)K_1\{7 - 4\cos(2\theta) - 3\cos(4\theta)\} + (1/128)K_2\{2 - \cos(2\theta) - 2\cos(4\theta) - \cos(6\theta)\},$$

where θ is the magnetization vector direction measured from the <100> bcc direction in the film plane, and $K_1$ and $K_2$ are the first and second order magnetocrystalline anisotropy energy density constants, respectively. The higher order energy terms are usually much smaller and are neglected here.

For pure Fe, $K_1$ is often quoted to be about $+4.7 \times 10^5$ erg/cc, but can be tailored by chemical additions. On the other hand the disordered bcc form of $Co_{50}Fe_{50}$ is believed to be about $-1.5 \times 10^5$ erg/cc while the ordered bcc derivative, B2, form of $Co_{50}Fe_{50}$ is about zero. Interestingly, the $K_1$ value for both the ordered and disordered alloys are about the same when the Co atomic percent is 35% or less. $K_1 \sim +1 \times 10^5$ erg/cc for $Co_{35}Fe_{65}$ and approaches the Fe value for Co content of less than 25%. This alloy is of particular interest due to its very high $M_s$ value and interesting anisotropy properties as a function of composition. See "Modern Magnetic Materials Principles and Applications" by R. C. O'Handley, pages 190, 192 for anisotropy constants and page 145 for saturation magnetization values. The higher order anisotropy constants, such as $K_2$, are less well known, but are usually smaller in magnitude and are weighted less heavily in the energy expression. Only in cases where the role of $K_1$ tends to vanish do the $K_2$ terms seem to play a significant role in these calculations. In the description of variant sets which will follow below, it is important to note the 2θ harmonics will play a dominate role while the 4θ harmonic tends to cancel out. Furthermore, the 6θ harmonic of the second order anisotropy energy term is weighted significantly less than the 2θ or 4θ harmonic. Hence, in most cases the effect of this 6θ harmonic can be neglected. While one skill in the field of magnetism will understand that the higher order anisotropy energy densities may play a small role in this invention, for simplicity of explanation they will be neglected in the following derivations.

While the smallest energy minimum for the function $(K_1>0)$ is at the in-plane <100> direction there are two equal maximums along the in-plane <111> directions [7]. Hence, there is a localized minimum [8] located between the two <111> directions and directed along the <110> direction. Hence, this texture does not yield uniaxial behavior and is subject to domain wall motion resulting in highly non-linear switching for all directions of applied field when the sample is driven near to saturation. There is a reasonably a large region of monotonic behavior on this energy curve where the response conceivably could be reversible and low loss if the magnetic configuration was single domain orientation. Conceptually if the magnetization is initially all pointed along the <001> direction and then is rotated toward one of the in-plane <111> hard axes by an applied field the process could be reversible, hence lossless, until the magnetization approached the hard axis. However, as the magnetization crossed the in-plane <111> direction it would then abruptly jump towards the localized energy minimum at the in-plane <110> direction. This jump is not reversible and so represents a lossy process. Since a 90-degree domain almost always wall exists, or forms, between the magnetization pointing along the in-plane <001> and <110> directions then wall motion dominates any possible rotational mechanism. Grain boundaries or defects in the film structure would cause localized wall motion jumps, again resulting in loss mechanisms.

In the 0 to 180 degree region of the energy plot, FIG. 4, we see, for the case of $K_1>0$, the one minimum [9], two maximums [7], and a localized minimum [8] corresponding to the single <100>, two <111> and single <110> directions, respectively, of variant [6] of FIG. 3. These extremes would invert if the $K_1<0$. Clearly, this curve does not satisfy our definition for a uniaxial magnetic material.

SUMMARY OF THE INVENTION

The present invention is directed generally to oriented thin film magnetic materials and devices including magnetic sensors, transducers, electronic circuit components, recording heads, recording media, and data storage systems, incorporating the said, thin film oriented magnetic materials and, more particularly, crystallographically oriented thin film materials and oriented magnetic layer structures utilizing materials such as iron, nickel, and cobalt, and alloys of the same. In particular, this invention deals with a structure to achieve uniaxial magnetocrystalline orientation via the use of the (110) texture of body centered cubic (bcc) or body centered cubic derivative crystal thin film structures. In general, the bcc or bcc derivative materials have higher saturation magnetizations than face centered cubic and the invention of orientation control of bcc and bcc derivative materials allows new devices to be constructed, which have good orientation, high magnetization, high permeability and low losses. These devices are used to detect or determine magnetic fields, store and retrieve data, and to transform energy or perform electronic signal processing. Improved magnetic properties or orientation of the magnetic properties of the materials when used in such devices result in better technical performance or allows for the construction of smaller, faster or less expensive systems. In most existing magnetic devices, with designs utilizing traditional magnetic materials structures, the performance is significantly improved by simply replacing the traditional magnetic material structure with the new structure described herein.

BRIEF DESCRIPTION OF THE DRAWINGS

The advantages of the present invention can be better understood by reference to the drawings in which:

FIG. 2 shows the magnetic hard axis response function, $M_x$, to an applied field along the hard axis, $H_x$, for the uniaxial Stoner-Wohlfarth model; and the magnetic easy axis response function, $M_y$, to an applied field along the hard axis, $H_x$, for the uniaxial Stoner-Wohlfarth model.

DETAILED DESCRIPTION OF THE PREFERRED EMBODIMENTS

The material structures of the invention can be embodied in both magnetically hard and soft magnetic devices including magnetic field sensors, transducers, electronic circuit components, magnetic solid state memory, antitheft devices, recording heads, recording media, and data storage systems, incorporating the said, thin film oriented magnetic materials and, more particularly, crystallographically oriented thin film materials and oriented magnetic layer structures utilizing materials such as iron, nickel, and cobalt, and alloys of the same. These structures are especially useful where the embodiment of the device requires special magnetic orientation, specific linear or non-linear response, or a low loss response.

Figure 1:
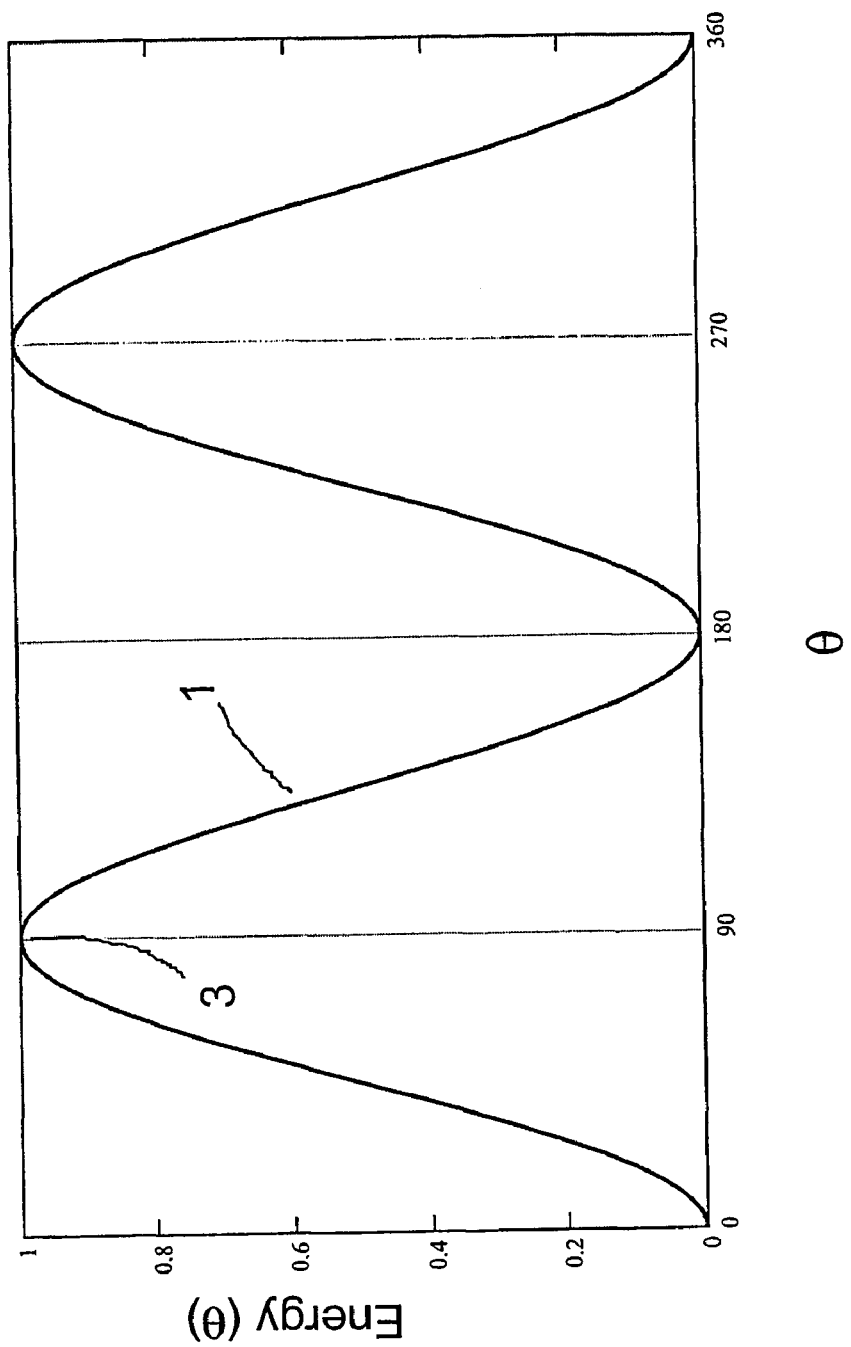
FIG. 1 shows a plot of the magnetic anisotropy energy density for the uniaxial Stoner-Wohlfarth model.
Figure 3:
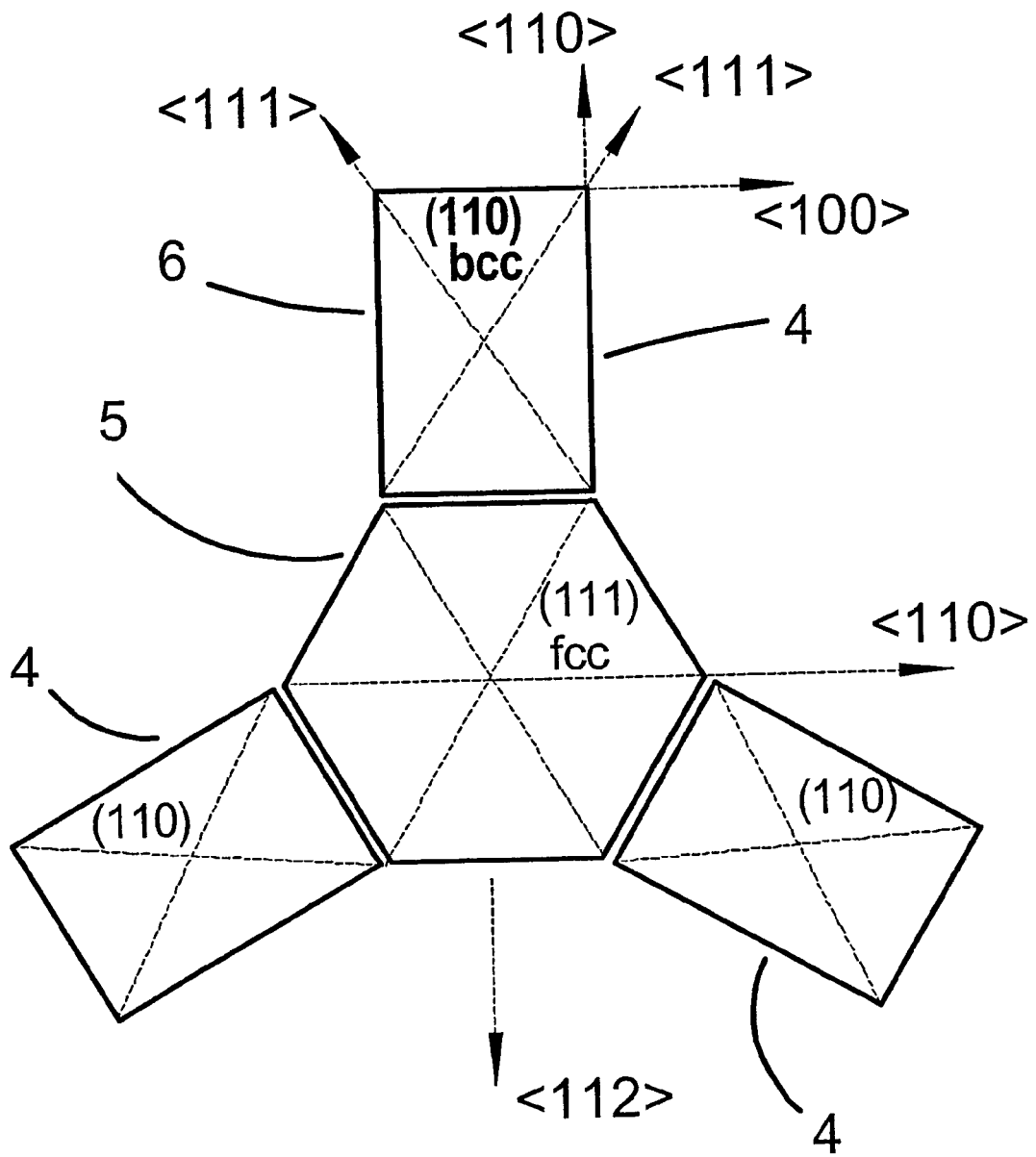
FIG. 3 shows an illustration of the historical three orientational variant arrangement of the (110) crystal plane of a bcc crystal in comparison to the atomic arrangement of the (111) crystal plane of an fcc crystal.

By carefully controlling the epitaxial growth conditions of (110) crystalline textured bcc or bcc derivative thin film materials on highly oriented (111) hexagonal atomic templates the applicant has invented a new set of six crystalline variants with special orientational relationships. By the selection and the growth of a very special exchange coupled subset of these six orientational variants a symmetry broken uniaxial magnetic thin film is obtained. The (111) textured fcc, (111) textured fcc derivative, or an (0002) textured hcp crystals are examples of the (111) textured hexagonal atomic template. In each of these cases the atoms of the template are close packed. When a highly oriented (111) hexagonal template is available a highly oriented bcc or bcc derivative (110) texture structure can be epitaxially grown. With the combination of being highly oriented and the use of special processing techniques the six new variants can be constructed. Since under many circumstances the bcc and the bcc derivative materials form a single class of behavior, we shall consider the notation "bcc-d" to represent either a bcc or a bcc derivative crystal structure. Likewise, the notation "fcc-d" shall be used to represent either an fcc or fcc derivative crystal structure. For example, here materials with the NaCl prototype structure are considered to be a fcc derivative as there is a close packed hexagonal pattern of atoms in the (111) plane. The (111) plane of atoms of these fcc-d and (0002) plane of hcp crystals are always close packed and so are different from the (111) atomic crystal planes of many fcc Bravais lattices, which are not close packed. For example, the Si, diamond structure, substrate is a member of the fcc Bravais lattice F3dm space group. Likewise, the C15 (Strukturbericht designation) is a member of the F3dm group, which does not have a close packed (111) plane. From FIG. 3 one can see that there are three hexagonal template <110> directions similar to [10]. It was found that, by carefully controlling the epitaxial film growth conditions, a strongly (110) textured bcc-d crystal could be made to grow with one of its <111> directions parallel to the hexagonal template <110> directions. This orientation is different than was obtained by the processing of Gong and Zangari. In our processing the bcc-d <110> directions are no longer parallel to the hexagonal template <112> directions.

Before discussing the new 6 crystalline (110) textured bcc-d variant system it is worthwhile to further analyze the 3 crystalline (110) textured variant system. The energy expression for the single variant, $E_{110}(\theta)$ was given earlier and discussed in the context of FIG. 4. It is important to point out that if there were two dominate variants of this (110) textured bcc on the same (111) textured fcc crystal surface and if they were magnetically coupled by being in contact or via another magnetic material being in contact with each of them then the magnetization vector of each of the variants would tend to move or rotate together. Likewise, if there were all three variants, as illustrated by [4] in FIG. 3 and espoused for Cr, in both the Gong and Zangari literature, and the three variants were magnetically coupled the magnetization of each would tend to move with the others. Of course Cr has no magnetic moment and so neither Gong nor Zangari discussed this. The anisotropy energy density equation for equal amounts of each of these three crystalline variants, with the magnetization rotating together would be written as the sum of each of the variants:

$$E_3'(\theta) = \{E_{110}(\theta) + E_{110}(\theta-60) + E_{110}(\theta-120)\}/3.$$

Here $\theta$ is the angle of the magnetization vector with respect to the <100> direction of the original single variant [6]. Because the underlayer in-plane fcc <112> directions are at 60 degree intervals, the two other bcc (110) texture variant easy axes are located at 60 degree intervals with respect to the first. By simple trigonometry it can be shown that the sum of the energy of these three variants is a constant of $(7/32)K1$ and has no $\theta$ dependence. Hence, there are no net anisotropy directions. However, in actual materials, since domain walls can form, the localized anisotropy of each variant, in combination with material defects, results in a significant coercivity and lossy behavior.

Because the reference point in any energy calculation is arbitrarily chosen one can always add a constant to the energy function without changing the predicted physical behavior. Also, since the combined energy in the three variant case just discussed is a constant, it is obvious that if there were only two coupled variants the energy function would be simply proportional to the negative of the single variant case. Writing this statement mathematically:

$$\{E_{110}(\theta) + E_{110}(\theta-60) + E_{110}(\theta-120)\}/3 = 7/32.$$

Hence, for a material with only two variants $$E_2'(\theta) = \{E_{110}(\theta-60) + E_{110}(\theta-120)\}/2 = 21/64 - E_{110}(\theta)/2.$$

Therefore, after normalizing the energy density by the appropriate unit volume of material, the energy curve of the two, coupled variants is simply ½ the inverted energy curve of the single variant of the same total unit volume of material. The curve shape and energy minimums and maximums interchange position and so the hard axes and easy axes directions would interchange. Any localized easy axis or energy minimum, such as [8], would become a localized hard axis or energy maximum. Recall that the constant in the energy expressions is arbitrary and has no effect on the physical response so it can be considered to be equal to zero in any analysis. Hence, the response of a magnetically coupled pair of these variants appears as a single variant material with a change in sign of the $K_1$ value and a decrease in the amplitude of the differences in the energy extremes by a factor of ½. Hence, whether the material of a (110) textured cubic magnetic material is composed of a single variant, two coupled variants or three coupled variants the magnetocrystalline anisotropy energy density function does not yield uniaxial behavior, but a form of bi-axial behavior. Therefore, when there are three possible variants of bcc magnetic material located at 60 degree intervals, as advocated for the non-magnetic bcc Cr by Gong et al and Zangari et al, and whether a (110) textured cubic magnetic film is polycrystalline or is epitaxially grown on a single crystal, it cannot possess uniaxial behavior. Hence, the M versus H response function will have coercivity and lossy behavior. Furthermore, uniaxial behavior cannot be obtained even if the volumes of each of the three variants are arbitrarily selected. When the volumes of the three variants are not equal we herein refer to the sample as being "symmetry broken."

It is also clear that should all three variants be present, but that either one or more than one be of more volume than the others then the energy properties of the larger volume variants will be dominate. To clarify this, simply consider the case of FIG. 3 where 6 has a volume fraction of ½ while the other two equal volume variants have a volume fraction of ¼ each. Then ½ of the volume of 6 is equal to the volume of each of the other two. So the energy terms from these three quarters of the total volume would be equally portioned and sum to a constant. This then would leave the remaining ½ of variant 6 to provide an energy curve of the shape of FIG. 4. Hence, we herein referred to the larger volume variants as being "dominate."

It is important to note that nowhere in U.S. Pat. No. 6,248,416 or in Gong et al or Zangari et al, was the use of any magnetic bcc or bcc derivative thin film discussed. Nor were magnetic bcc or bcc derivative materials investigate or advocated as the magnetic layer. If they had been investigated, and found to have the same three variant crystalline orientational relationships that were found for bcc (110) Cr when placed on a (111) fcc layer, the magnetic properties would have had to have been lossy and to have significant coercivity. Furthermore, they never suggested that they obtained a sample situation where the volumes of each of the variants were not equal. Hence, at no time did they discuss a symmetry broken variant system nor a dominate variant system.

Likewise it is important to note that in their discussion of FeCoN thin films Sun and Wang provided no evidence regarding any (110) textured variants. Furthermore, they offered no explanation for the anisotropy the observed and because their anisotropy fields appeared to be the same whether or not permalloy was placed under their CoFeN film their results were not dependent upon on any ordered variant structure. Furthermore, their results showed a strained lattice and a significant $Fe_4N$ second phase indicating a possible anisotropy mechanism associated with strain or shape effects as discussed by Chikazumi.

Figure 5:
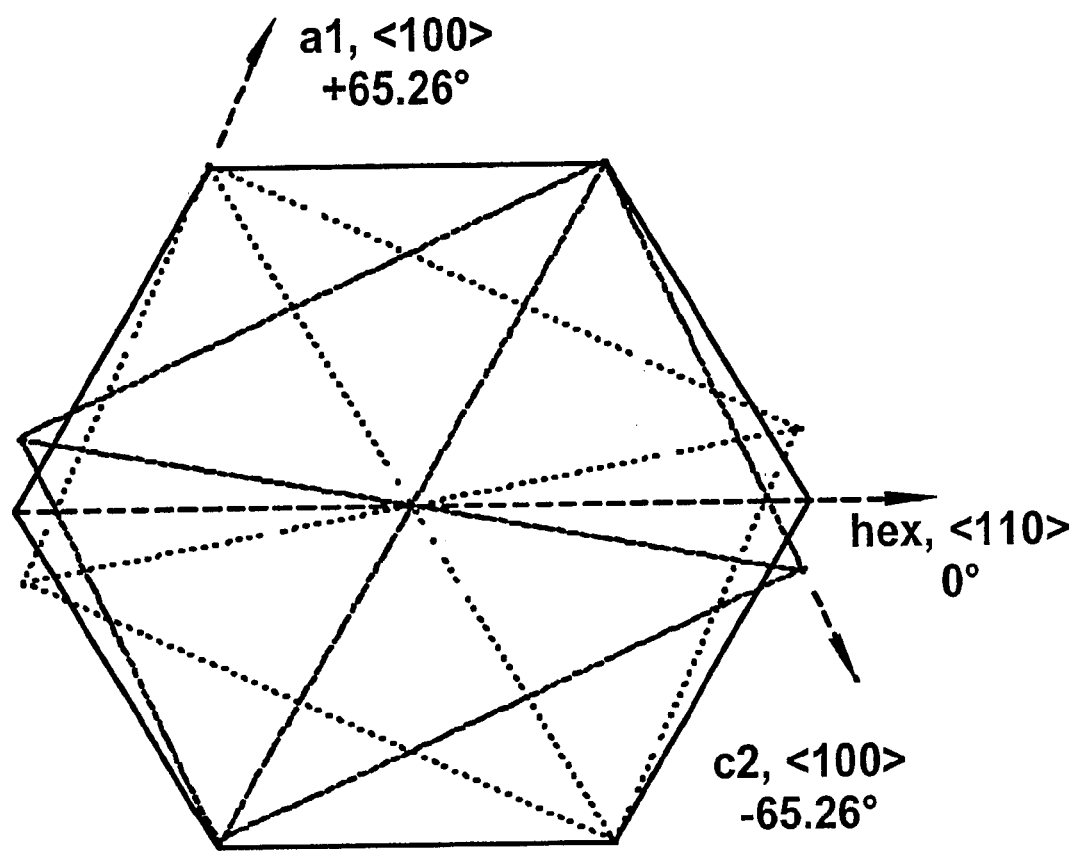
FIG. 5 shows an illustration of two of the six possible orientational variants of the (110) crystal plane of a bcc-d crystal in comparison to the atomic arrangement of the (111) crystal plane of a hexagonal lattice template crystal.

It is well known that crystallographic twinning can form at the (112) planes of the bcc-d. These (112) planes contain both a <110> and a <111> direction. Hence a pair of bcc-d twins can form with an interface along the plane containing the thin film surface normal and containing one of the hexagonal template <110> directions. In this arrangement the hexagonal template <110> directions coincides with one of the bcc-d <111> directions. Hence, for bcc-d (110) texture films that have grown with a <111> direction parallel to a hexagonal template <110> direction, there are two possible variants. Since there are three possible hexagonal template <110> directions, then there three possible sets of twins. Hence, we are lead to the concept that there are 6 possible bcc-d variants that could be grown. However these variants do not have to be in a twinned configuration to exist. For clarity, only two of these six possible variants are shown in FIG. 5. The other four variants can be constructed by rotating the positions of these two by 60 and 120 degrees. This sketch is meant to be illustrative in showing the orientation of the variants and it is to be understood that a single variant would extend over a considerable some of atomic distances.

The angle formed between the bcc-d <111> direction and the bcc-d <100> direction is given by $\arctan(\sqrt{2})=54.736$ degrees. Likewise, the angle between the <111> direction and the <110> direction is $\arctan(1/\sqrt{2})=35.264$ degrees. The sum of these two angles is of course 90 degrees and forms the angle between the <100> and <110> directions. The importance of this 54.736 degree angle value is that it differs from the 60 degree interval of the <110> directions of the hexagonal template by 5.264 degrees. In contrast to the three variants observed by Gong and Zangari, the <100> directions of the proposed six bcc-d variants do not lie parallel to any of the hexagonal template <110> directions. Furthermore, where as for the Gong and Zangari symmetrical arrangement where none of the <111> bcc directions lie parallel to the hexagonal template <110> directions, for our new variants one of the bcc-d <111> directions lies parallel to one of the hexagonal template <110> directions and the bcc-d <100> direction does not lie parallel to the <110> hexagonal template. Hence, for a coordinate system where θ=0 at the hexagonal template direction ([110], the bcc-d variant crystal <100> directions and easy magnetic axis ($K_1>0$) lie at angles of $\beta_i=0\pm\delta$, $60\pm\delta$ and $120\pm\delta$ degrees where $\delta=60-\arctan(\sqrt{2})=5.264$ degrees. In FIG. 5, it is also important to note the orientation of the two <111> directions of each of the two the bcc-d variants. They match the 60 and 120 degree hexagonal template <110> directions, but near the 0 degree axis they differ from the <110> axis by + and −2δ. When exchange coupled this variant pair will be represented by an energy function $E_{2-a1c2}(\theta)$ in the discussion below.

For a (110) textured bcc-d crystalline structure containing six equally occurring magnetically coupled variant volumes the anisotropy energy density function is written as:

$$E_6(\theta)=\{E_{110}(\theta\pm\delta)+E_{110}(\theta-60\pm\delta)+E_{110}(\theta-120\pm\delta)\}/6,$$

where the + and − signs are to represent two functions for each angle in this expression. As before, it can be mathematically shown that the total anisotropy energy of this symmetrically balanced arrangement of six variants, six $E_{110}$ energy terms, has no angular dependence and so the anisotropy energy density function is a constant, $K_1(7/32)$. However, of particular interest here are the cases when only an odd or even numbers of particular variants are coupled. It is important to consider that any one or more of the six variants could possibly grow on a hexagonal template and it is not a requirement that they appear in twin pairs or of a balanced, equal amounts of material. However, for clarity, during the discussion of the next few paragraphs we will consider the amounts of material in each variant of a coupled group of variants to be balanced to be equal. That is to say, for example, if there are only three variants coupled together we shall assume that the volume of each of the three is equal.

Figure 4:
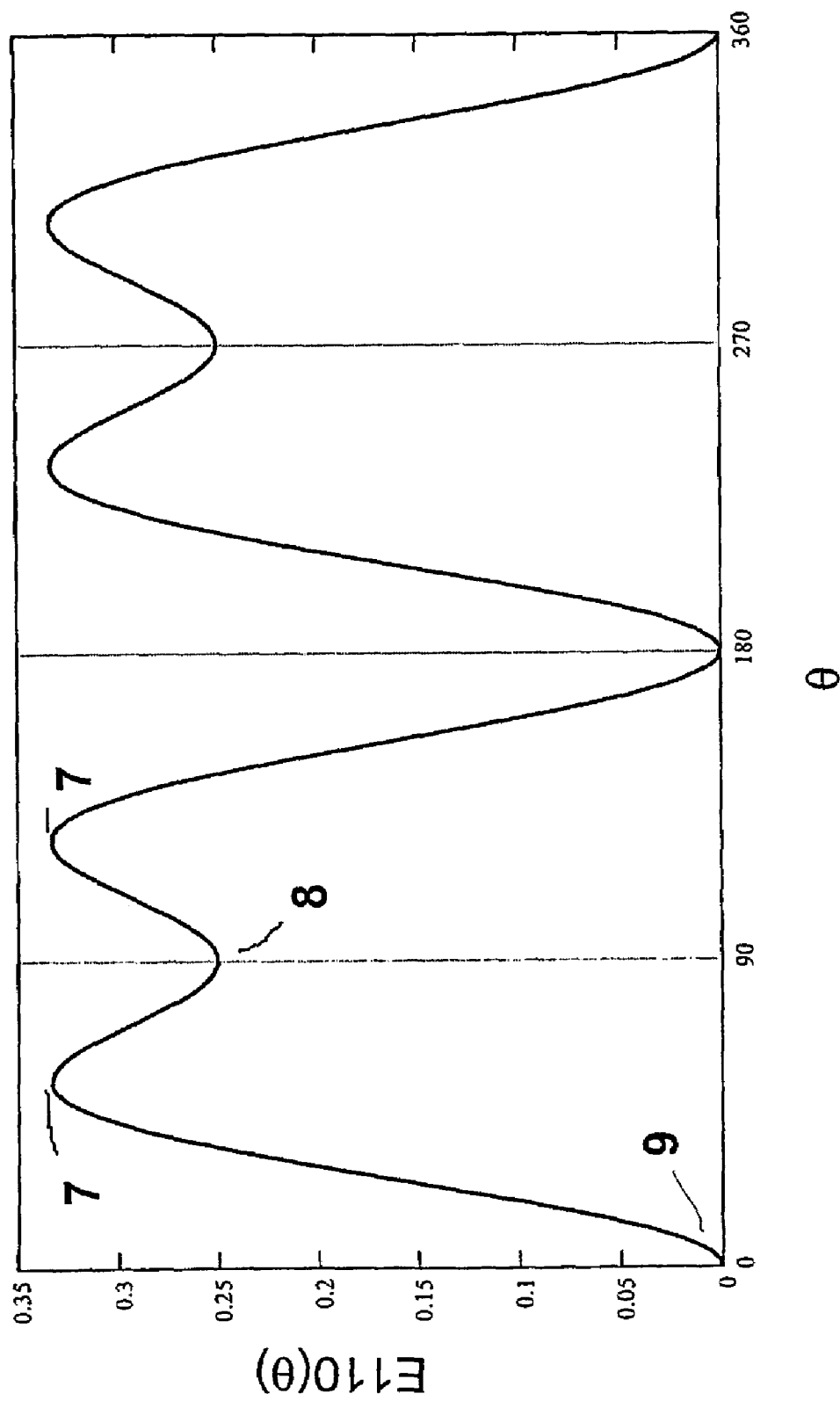
FIG. 4 shows a plot of the magnetic anisotropy energy density versus magnetization direction in the plane for the (110) texture plane of a cubic crystal, where the first order anisotropy energy density constant, $K_1$, is positive.

If there is only one of the six variant then the energy density function simply reduces to that of $E_{110}(\theta)$ shifted by the particular variant offset angle $\beta_i$. Likewise, if there are five of the six variants then, similarly to the earlier logic and ignoring the unimportant energy constant offset or origin, the resulting normalized energy density function is negative ⅕th the energy function peak to peak value of the missing variant. As shown in FIG. 4, since the $E_{110}(\theta)$ function has two maximums, one minimum and a localized minimum (for $K_1>0$, or two minimums, one maximum and a localized maximum for $K_1<0$), these two possible sets of coupled variants yield energy functions that do not represent uniaxial magnetic material behavior. There are three other possible sets of numbers of coupled variants; two, three, and four variants per combination. However, there is more than one way to form each of these, as there are six variants to choose from. Here, we continue to consider each of the variants in a set to be balanced or of equal volume of material.

As stated before there are six possible bcc-d variants each with a single crystalline <100> direction in the plane (and easy magnetic axis when $K_1>0$) lying at one of the six angles $\beta_i=+0\pm\delta$, $+60\pm\delta$ and $+120\pm\delta$ degrees. We shall denote these six possible variants by the names: a1(60+δ), a2(60−δ), b1(0+δ), b2(0−δ), c1(120+δ), and c2(120−δ), where the angle in the corresponding parenthesis represents the angular location of the bcc-d <100> direction for the given variant relative to the <110> direction [10] of the hexagonal template. We see that, for example, the a1 and a2 variants are located at, or deviate by, +δ and −δ degrees, respectively, from the 60 degree position of the <110> direction of the hexagonal template.

Special Case: δ=7.5 Degrees

Before discussing the energy density curves for the various other combinations of variants it is informative to consider three particular sets of two couple variants of the possible fifteen cases of pairs. However, we now consider the special case when the deviation angle of the variant, δ, is not equal to $60-\arctan(\sqrt{2})=5.264$ degrees, but is exactly equal to 7.5 degrees. The three particular sets of energy density functions of interest are written as:

$$E_{2\_b1a2}"(\theta)=\{E_{110}(\theta-0-7.5)+E_{110}(\theta-60+7.5)\}/2,$$

$$E_{2\_a1c2}"(\theta)=\{E_{110}(\theta-60-7.5)+E_{110}(\theta-120+7.5)\}/2,$$
and $$E_{2\_c1b2}"(\theta)=\{E_{110}(\theta-120-7.5)+E_{110}(\theta-0+7.5)\}/2.$$

The subscripted energy function notation, for example, $E_{2-b1a2}"(\theta)$ represents the two variants b1 and a2 coupled as a pair. The quotation mark, ", is used to denote this special δ=7.5 degree case. We see that in each of these three cases the coupled variants are phase shifted by exactly 45 degrees from each other. It can easy be shown, by trigonometry for this particular δ=7.5 degree angle, that for each of these pairs, which are separated by 45 degrees phase angle, the only dependence on θ is of the form of $\cos^2(θ)$. In particular, it can be shown that:

$$E_{2\_b1a2}''(θ)=(K_1/64)\{14-8\cos(45)+16\cos(45)\cos^2(θ+60)\},$$

$$E_{2\_a1c2}''(θ)=(K_1/64)\{14-8\cos(45)+16\cos(45)\cos^2(θ)\}, \text{ and}$$

$$E_{2\_c1b2}''(θ)=(K_1/64)\{14-8\cos(45)+16\cos(45)\cos^2(θ-60)\}.$$

$E_{2\_a1c2}''(θ)$, for example, represents a coupled pair of variants that has a Stoner-Wohlfarth hard axis at zero degrees and easy axis at 90 degrees, while the individual variants have their easy axes (<100> directions for K1>0) angled at +67.5 and 112.5 degrees. In other words, each of these paired variants result in an energy function that is of the same functional form as the uniaxial Stoner-Wohlfarth model with an easy axis (K1>0) angle located half between the easy axis directions of the two individual variant easy axis locations. This Stoner-Wohlfarth behavior only occurs because of the coupling of the two variants and their specific 60−2δ=45 degree orientation with respect to each other. It is also clear that if the anisotropy energy density constant K1<0 the direction of the resulting easy and hard axes of the coupled pair of variants invert.

Each of these paired variants not only results in a uniaxial energy function, but, as discussed earlier for FIG. 2, in a zero loss hard axis driven $M_x$ versus $H_x$ response function and a non-linear, quadratic $M_y$ vers $H_x$ response function. (To a reasonable approximation this will turn out to also be the case for δ=60−arctan($\sqrt{2}$)=5.264 degrees.) Each of these three coupled pairs (δ=7.5) represents an ideal way to construct an ideal uniaxial response from a (110) textured bcc-d magnetic material. As before, because the sum of the energy functions of all six possible variants is equal to a constant, $K_1(7/32)$, then in each of these three paired variant cases the sum of the remaining four variant energy functions is equal to −¼ of the sum of the paired variants. Hence, there are three particular sets of four coupled variants that sum to yield a Stoner-Wohlfarth type energy function, however because of the negative sign, its hard and easy axes are rotated by 90 degrees relative to the corresponding coupled pair and the peak to peak energy amplitude swing is ½ that of the coupled pair case. Hence, these three sets of four coupled variants result in, a Stoner-Wohlfarth, linear and lossless M versus H response functions when driven along the net hard axis. From a notation standpoint we should state that the coupled variants represented by the energy function $E_{2-b1a2}''(θ)$ and corresponding $E_{4-a1b2c1c2}''(θ)$ are complements. After all, similarly to before $$E_6''(θ)=\{2E_{2\_a1c2}''(θ)4E_{4\_b1a2b1c2}''(θ)\}/6=K_1(7/32) = \text{constant}.$$

Figure 6:
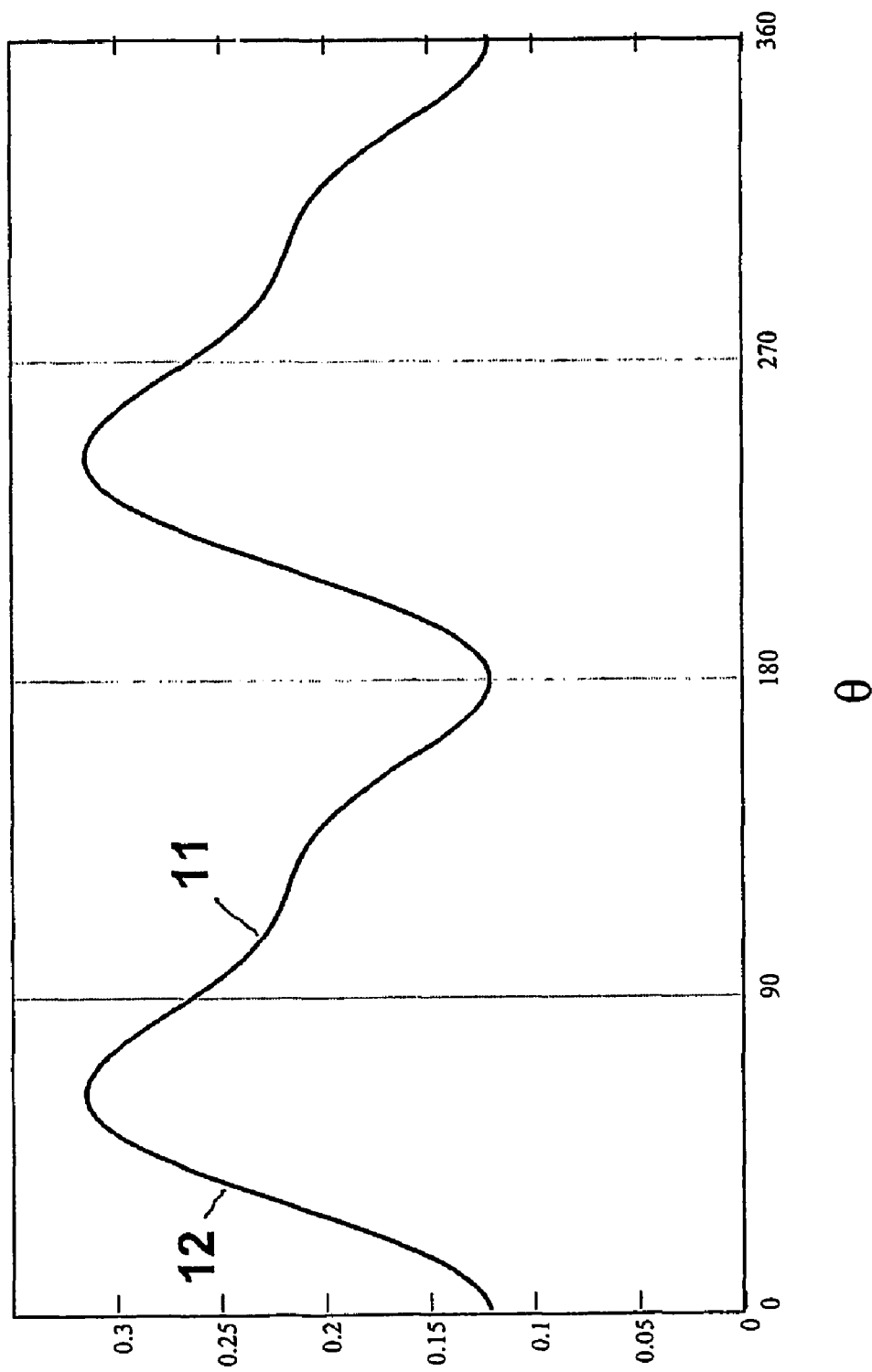
FIG. 6 shows a plot of the magnetic anisotropy energy density versus the in-plane magnetization direction for the specific case of three (b1, b2, and c1) coupled (110) variants, of the six bcc-d (110) textured variants when K1>0 and δ=7.5 degrees. Only one energy minimum and one energy maximum per 180 rotation occurs.

It should also be noted that there are twelve other possible combinations of pairs of coupled variants and that none of them yield a uniaxial energy function. Some are worst than others in terms of the depth of the localized energy minimum. Likewise, the corresponding twelve other possible complementary foursomes of coupled variants cannot yield uniaxial behavior, because they can be written in terms of the non-uniaxial coupled pairs of crystallographic variants. This analysis now only leaves the twenty possibilities for sets of three coupled variants to be considered. By similar logic as used before, ten of them are complements (negatives) of the other ten. Fourteen of them have either double minimums or maximums and localized extremes. The other six satisfy the definition of uniaxial anisotropy energy functions, but each does contain a wavy portion [11] of the energy curve located about midway between, and only on one side of, the single minimum and the single maximum. A response curve when driven at an angle between this wavy portion and the hard axis would be nearly lossless, but non-linear over large portions of the response curve. If driven along an angle constrained to the smooth part of the curve near the hard axis [12] the response would be lossless and more linear over just this portion of the drive. A representative plot of one of these six energy curves, $E_{2\_a1b2}''(θ)$, is shown in FIG. 6.

In summary, not including the previously discussed six singular variants and the null case of all six, there are fifty six possible combinations of equally weighted variants. Hence, when the variant phase angle is set to 7.5 degrees, there are six possible balanced variant combinations that will yield exact Stoner-Wohlfarth like energy curves and corresponding M versus H response functions, plus there are six possible balanced variant combinations that will yield uniaxial, but wavy energy density functions. All others yield non-uniaxial behavior.

For completeness, we briefly consider the effect of higher order anisotropy energy terms. An energy expression example, for the uniaxial case of a coupled pair of variants, when the second order anisotropy energy density constant, $K_2$, is non-zero, is given by:

$$E_{2\_a1c2}''(θ)=(K_1/64)\{14-8\cos(45)+16\cos(45)\cos^2(θ)\} +(k_2/64)\{1-\cos(45)/2+\cos(45)\cos^2(θ)+\cos(45)\cos(6θ)/2.$$

We investigated this function and found that the effect of the 6θ harmonic is of most significance to the uniaxial behavior when the magnitude of $K_2$ is comparable to or larger than the magnitude of $K_1$. However, for many materials this is not the case and in most cases K2 is so insignificant that it is unknown. For example, for iron, it is sometimes reported that $|K_1/K_2|>5$, but in some publications it is unmeasurable. Nevertheless, if needed, a similar analysis could be conducted including $K_2$.

Special Case: δ=5.264 Degrees

We now return to the case where the variant phase angle δ, is given by 60−arctan($\sqrt{2}$)=5.264 degrees. The 5.264 degree phase angle is not largely different from the 7.5 degree value and the resulting energy curves for the same combinations of variants, but using 5.264 degree phase shifts, are similar to the special 7.5 degree cases just discussed. Uniaxial energy density curves are obtained for the same three sets of pairs of variants as observed before, but using the smaller δ value:

$$E_{2\_b1a2}(θ)=\{E_{110}(θ-0-5.264)+E_{110}(θ-60+5.264)\}/2,$$

$$E_{2\_a1c2}(θ)=\{E_{110}(θ-60-5.264)+E_{110}(θ-120+5.264)\}/2, \text{ and}$$

$$E_{2\_c1b2}(θ)=\{E_{110}(θ-120-5.264)+E_{110}(θ-0+5.264)\}/2.$$

We also note that each of these energy functions, or variant pairs, is the same if simply phase shifted by 60 degrees on the hexagonal atomic template, $$E_{2\_b1a2}(θ)=E_{2\_a1c2}(θ+60)=E_{2\_c1b2}(θ+120).$$

Likewise there are three sets of corresponding; complementary variant foursomes that yield similar, but inverted and reduced amplitude differences, energy curves. Furthermore, each of these energy functions, or variant foursomes, is the same if simply phase shifted by 60 degrees on the hexagonal atomic template.

Figure 7:
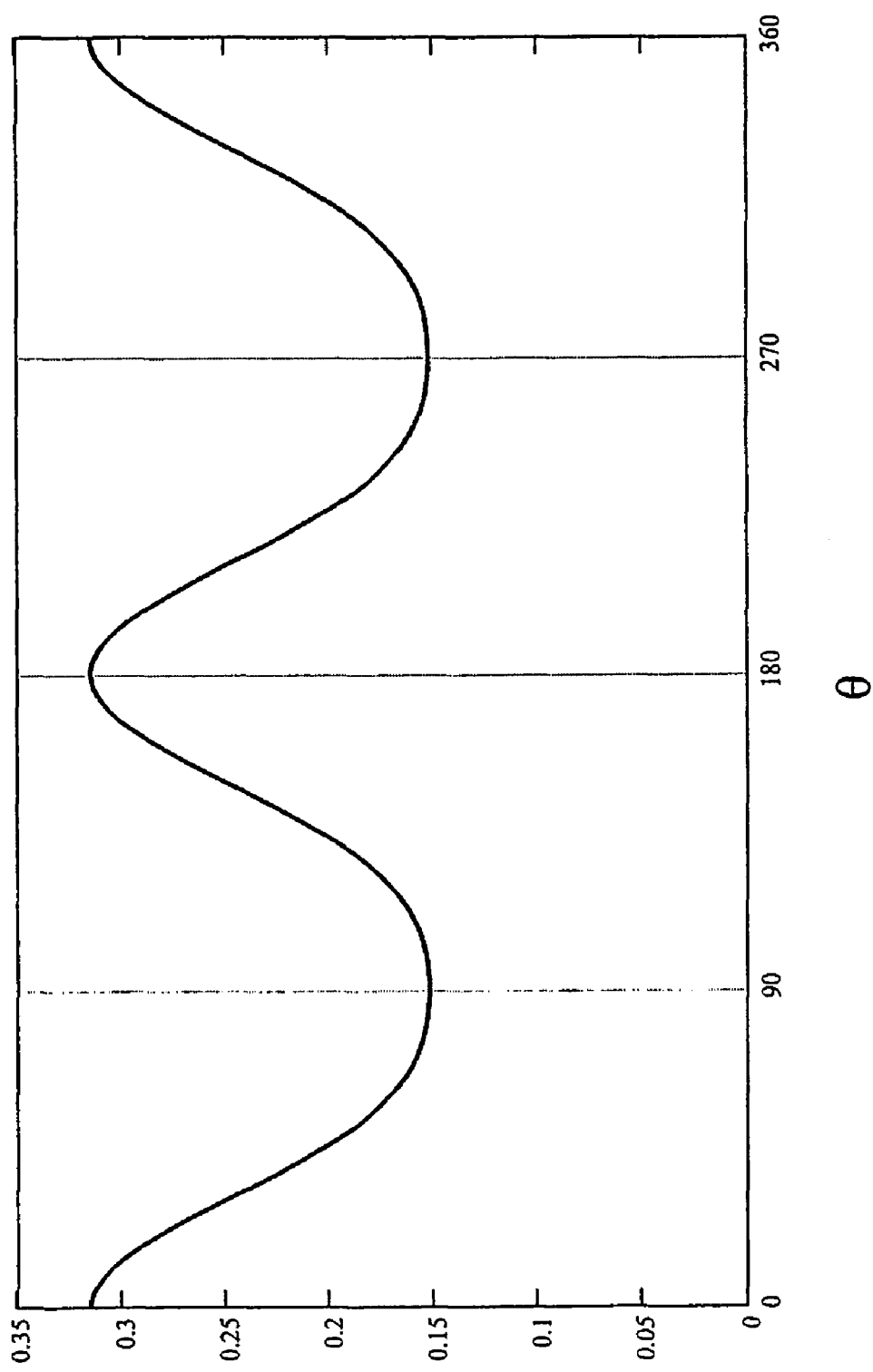
FIG. 7 shows a plot of the magnetic anisotropy energy density versus the in-plane magnetization direction for the specific case of two (a1 and c2) coupled (110) variants, of the six possible bcc-d (110) textured variants when K1>0 and δ=5.26 degrees. Only one energy minimum and one energy maximum per 180 rotation occurs.

As an example of the functional shape we use $K_1=1$, $K_2=0$ and plot in FIG. 7 the anisotropy energy density function for:

$$E_{2\_a1c2}(\theta) = \{E_{110}(\theta-60-5.264) + E_{110}(\theta-120+5.264)\}/2.$$

Figure 8:
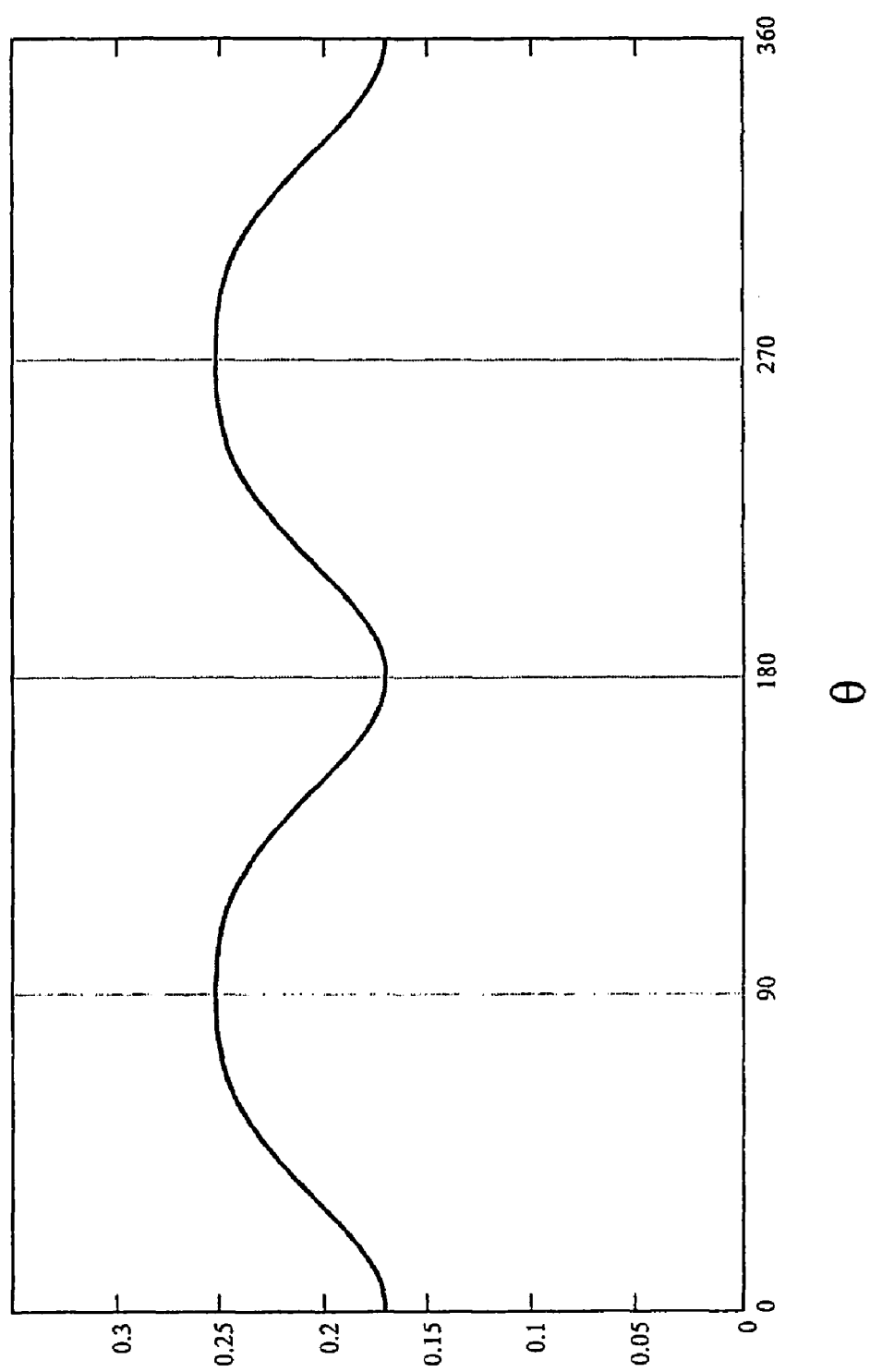
FIG. 8 shows a plot of the magnetic anisotropy energy density versus the in-plane magnetization direction for the specific case of four (a2, b1, b2 and c1) coupled (110) variants, of the six possible bcc-d (110) textured variants when K1>0 and d=5.26 degrees. Only one energy minimum and one energy maximum per 180 rotation occurs.

And, in FIG. 8 is plotted the anisotropy energy density function for the complement coupled variant set, corresponding to the foursome variant combination:

$$E_{4\text{-}b1a2c1b2}(\theta) = \{(E_{110}(\theta-0-5.264) + E_{110}(\theta-60+5.264) + E_{110}(\theta-120-5.264) + E_{110}(\theta-0+5.264)\}/4.$$

As discussed earlier, ignoring the additive constant, the anisotropy energy density function of FIG. 8 has a peak to peak difference of is just −½ the amplitude difference of the energy density function represented in FIG. 7. While these functions are very similar to the $\sin^2(\theta)$ or the $\cos^2(\theta)$ dependence of the Stoner-Wohlfarth model the curvature around the maximum and the minimum can be seen to differ. They are uniaxial in behavior, but the hard axis magnetic response function is somewhat non-linear, but free of lossy processes. The curve shape at the extremes invert, and so the easy and hard axes deviations, from the Stoner-Wohlfarth model, interchange, when $K_1<0$.

Figure 9:
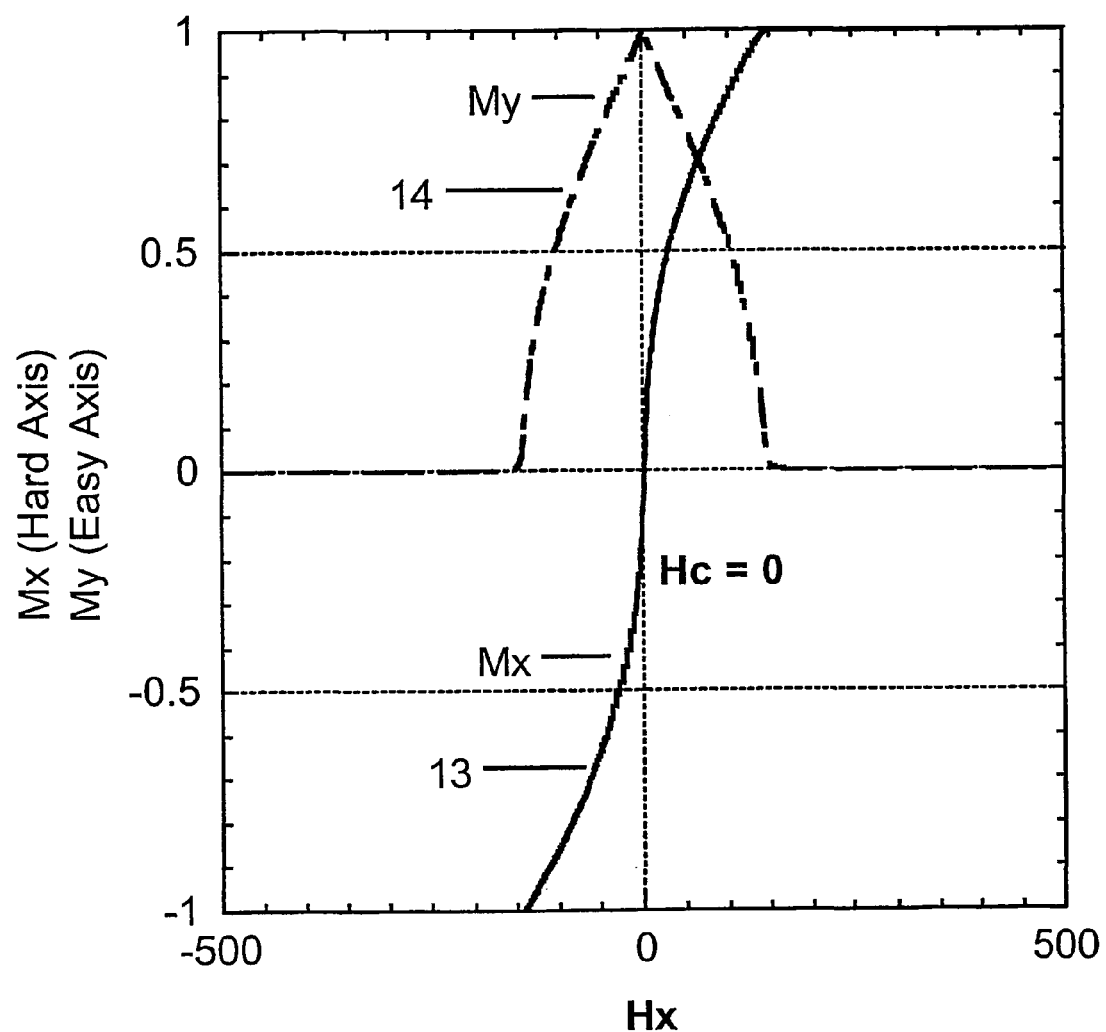
FIG. 9 shows the magnetic hard axis response function, $M_x$, and the magnetic easy axis response function, $M_y$, for an applied field along the hard axis, $H_x$, for the coupled variant pair (a1 and c2) when K1>0 and δ=5.264 degrees.
Figure 10:
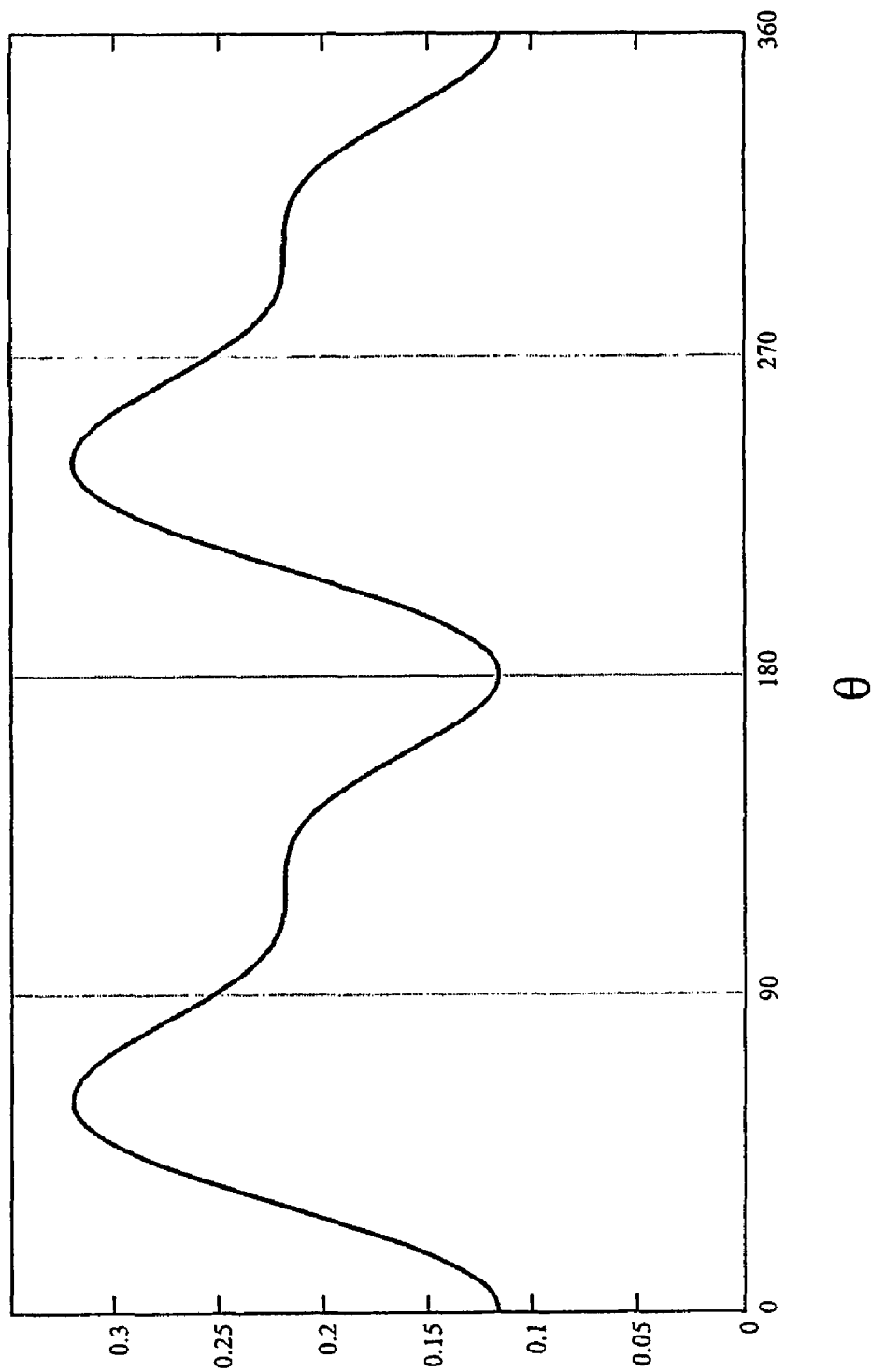
FIG. 10 shows a plot of the magnetic anisotropy energy density versus the in-plane magnetization direction for the specific case of three (b1, b2, and c1) coupled (110) variants, of the possible six bcc-d (110) textured variants when K1>0 and δ=5.264 degrees. Only one energy minimum and one energy maximum per 180 rotation occurs.

The $M_x$ [13] versus $H_x$ and the $M_y$ [14] versus $H_x$ response curves corresponding to $E_{2\text{-}a1c2}(\theta)$ are plotted in FIG. 9. The $M_x$ versus $H_x$ curve (solid) shows the non-linearity resulting from δ not exactly equaling 7.5 degrees. However it represents a lossless response. The $M_y$ response curve shows similarity to the quadratic behavior of the Stoner-Wohlfarth response. For completeness, FIG. 10 is provided to show the $E_{2\text{-}b1b2}(\theta)$ coupled variant energy curve for δ=5.264 degrees, which is analogous to that of FIG. 6 where δ=7.5 degrees. The curve is almost flat on the right side of the maximum. However, it still represents a uniaxial material. From these comparisons we can see that for δ=5.264 degrees there are also 12 possible uniaxial coupled variant sets.

If portions of a film are constructed from a coupled variant pair, for example $E_{2\text{-}a1c2}(\theta)$, and other portions of the film are constructed from a coupled variant foursome, for example $E_{4\_b1a2c1b2}(\theta+90)$, rotated 90 degrees then they both have a common easy and hard axis. The two film portions must not be strongly coupled so that the two separate coupled variant sets function independently. Then the two non-linear response functions can average to yield a net response function that is nearly linear. However we have found that the response of physical samples may contain some waviness. It is important to realize that to achieve the rotation of the foursome the templates for the two portions of the material need to be rotated relative to each other by 90 degrees so that the hard axes of the two material portions coincide. Of course because the hexagonal template repeats very 60 degrees of rotational it implies that the template actually only needs to be rotated 30 degrees to be equivalent to a 90 degree shift. This is because the symmetry breaking mechanism is common for both variant sets. Of course it is obvious that other variant sets, perhaps not balanced, can occur for template orientations between the 0 and 30 degree directions and may yield near linear behavior. This concept, of utilizing more than one group of different sets of coupled variants in a single sample, is very powerful as it enables the development of nearly linear magnetic response functions even for polycrystalline (110) textured bcc-d films epitaxially grown on polycrystalline, randomly oriented, (111) hexagonal atomic templates. This means that even though a single crystal substrate will yield the best and most easily understood performance, having a single crystal is not a requirement to achieve the near linear and low loss magnetic response function. The requirement is only that each group of coupled variants be selected and placed upon an appropriately rotated polycrystalline grain template so as to produce a nearly common hard magnetic axis for the entire sample. When a non-single crystalline substrate is used for the deposition of a highly (111) textured polycrystalline hexagonal atomic template the films will consist of individual grains with random in-plane orientation. The technique to obtaining the same easy and hard magnetic axis behavior across an entire polycrystalline sample is to induce the appropriate (110) textured bcc-b coupled uniaxial variant set for each of the randomly oriented hexagonal templates. The method of achieving this is to provide an energetically driven growth process that preferentially selects the appropriate coupled variant set for each hexagonal template orientation being use. In the experimental results that are to follow we have used both a magnetic field applied along the desired easy axis direction during magnetic variant film deposition or angular vacuum vapor deposition of the bcc-d material to select a direction for the crystallographic orientation growth. Deposition in an applied field was found to yield superior uniaxial behavior. However, unique subsets of the many variant sets were obtained in both cases. These methods result in a controlled uniaxial behavior for the magnetic film. Other methods of supplying an energetically favored crystallographic growth direction may include chemical plating in an applied magnetic field, chemical plating from a bath solution which flows along the substrate in a particular direction, deposition on a miss cut single crystal substrate, and deposition upon a strained, or distorted hexagonal template.

We believe that just as there is a preference for the formation of lowest energy atomic arrangements that can cause preferred crystalline textures, there is a similar mechanism in the symmetry breaking mechanisms to cause orientation in of the crystalline directions in the film plane. In particular, on a surface the resulting texture is usually the most close packed atomic arrangement. Hence, for angle depositions of bcc-d materials one would expect the <111> directions to tend to align with the direction of the depositing material. Furthermore, it has been found that since there are two <111> directions in the bcc-d (110) texture plane and multiple , <110> hexagonal template directions there is some latitude as to whether one of the <111> directions align exactly with the <110> template direction parallel to the deposition direction or that it align with one of the <110> directions at + or −60 degrees. The later is usually the case for unaxial materials. Also, the energies of film formation must be just balanced against the surface bonding energies otherwise this symmetry breaking will not occur. Likewise, we have found that unless the processing conditions are just right not only will the variants not be symmetry broken, but the variant set will be the three variants discussed by Gong and Zangari rather than the six new ones. By adjusting these competing energies the desired film structure can be obtained. Adjustment parameters include deposition rate, substrate temperature, vacuum quality against film oxidation, and hexagonal template atomic spacing and material composition. We have found that it is not necessary to achieve magnetic coupling between variants to achieve a symmetry broken structure. However, in order to achieve a uniaxial magnetic behavior the appropriate set of variants must be exchange coupled. The exchange coupling may be directly between the individual touching variants when their size and spacing is such that the exchange length is comparable or not to small compared to variant grain size. However, more preferred is to place a magnetic hexagonal template material directly in contact with the magnetic bcc-d film to assist the exchange coupling via the hexagonal shaped layer. Furthermore, while it has been observed that the hexagonal magnetic exchange coupling layer may be place either under or on top of the magnetic bcc-d layer it is most preferred to place it under the films and so also use it as the as the hexagonal atomic template. It is also viable to build multiple alternating layers of hexagonal templates and bcc-d magnetic layers.

Figure 11:
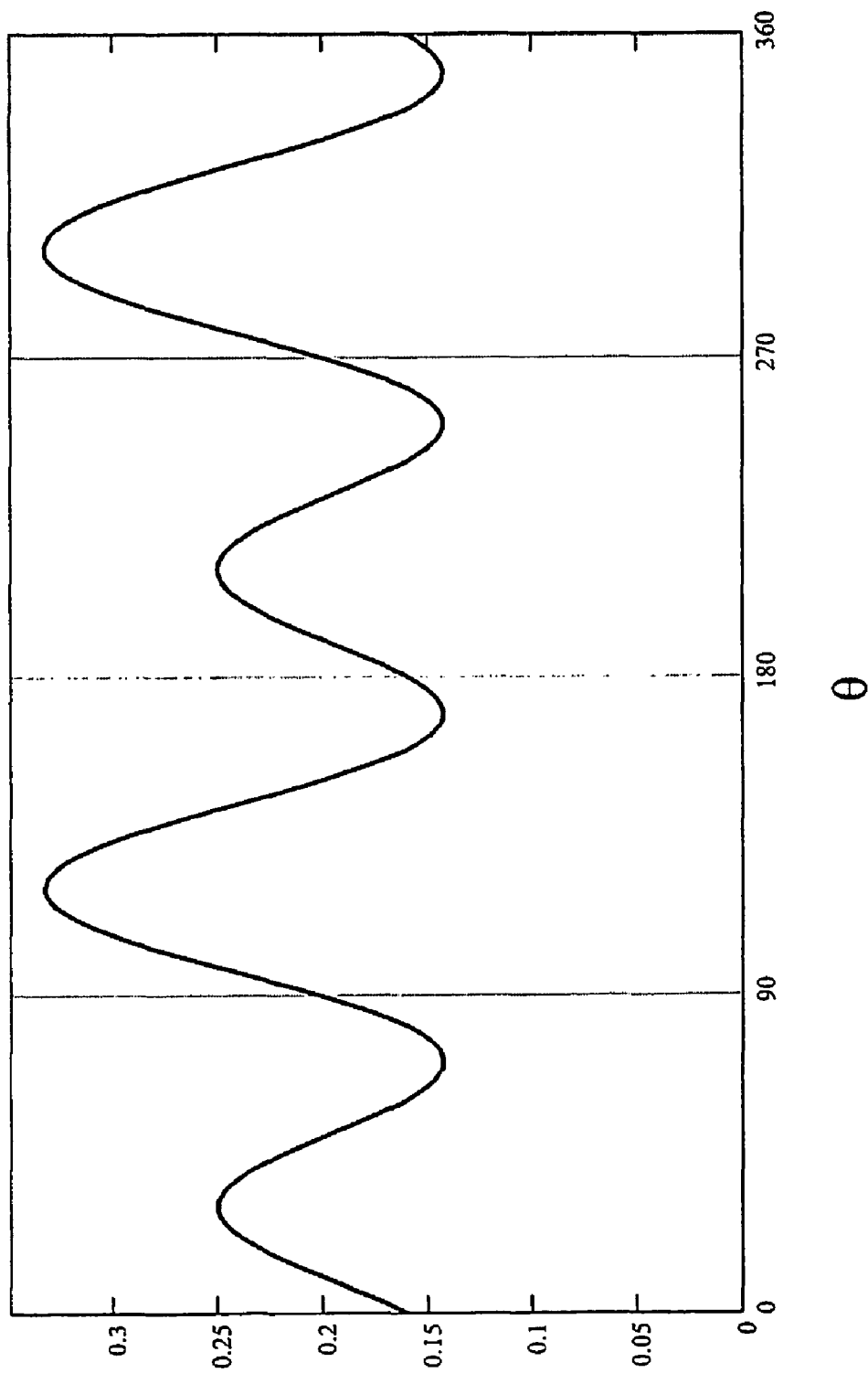
FIG. 11 shows a plot of the magnetic anisotropy energy density versus the in-plane magnetization direction for the specific case of two (a1 and b2) coupled (110) variants, of the six possible bcc-d (110) textured variants when K1>0 and δ=5.264 degrees. Two energy minimums and two energy maximums per 180 rotation occurs.

To illustrate that not all variant sets yield a uniaxial energy function a three variant set, $E_{3-b1b2c1}$, example is plotted in FIG. 11. Clearly this is not uniaxial, but bi-axial behavior.

Clearly there are a large number of possible ways of coupling sets of variants to achieve a lossless magnetization response function. For epitaxial growth on single crystal substrates the resulting hard and easy axes are correlated to the substrate directions. However, for polycrystalline substrates the epitaxially grown films contain multiple variant sets corresponding to the crystalline orientations of the individual hexagonal template grains. The appropriate set of couple variants are selected for the particular orientated polycrystalline hexagonal template via processing conditions and symmetry breaking mechanism. These coupled variant sets do not have to be equally weighted in volume in the sample. Also key, for used of both random in-plane oriented polycrystalline hexagonal template films, and for single crystalline substrates is the concept that the variants of the selected coupled set be sufficiently strongly magnetically coupled so that the magnetization vector of each of the variants of the set rotates together. The coupling is most likely via magnetic exchange coupling. Hence, we adopt the phrase "uniaxial symmetry broken" to denote the crystallographic characteristics of these uniaxial and nearly uniaxial, bcc-d materials, which have low coercivity and, so, low loss magnetic properties. A crystallographically "symmetry broken" material is defined to exit when individual, variant sets do not contain an equal amount of all six of the (110) textured bcc-d variants. We use the phrase "symmetry breaking mechanism" to describe the energic process by which a "symmetry broken" crystalline structure is obtained. Because of the conceptual complexity and multiplicity of these systems, we have only discussed at length the cases where the variants of a coupled set of variants are equally weighted (balanced) in volume of material. This does not have to be the situation and other interesting energy functions and response curves can be obtained for these cases. One trivial, but important case can be envisioned by considering a film composed of the six coupled variants. If the volume of each variant is equal then, as noted before, the energy density function is a constant and has no $\theta$ dependence. However, if two of the six variants are of different volume than the other four then uniaxial behavior can result. Consider the simple case when the two variants with different volumes of material are selected as one of the three Stoner-Wohlfarth variant pairs ($E_2''(\theta)$ or $E_2(\theta)$). If the quantity of material for this pair is slightly greater than the other four variants then this would break the symmetry and uniaxial behavior would result. However, the energy density difference between the minimum and the maximum would be decreased by the relative difference in volume of materials. For example, of the six couple variants suppose that each of variants of the Stoner-Wohlfarth like coupled pair occupied 30% of the total volume and each of the other four variants occupied 10% of the total volume. Then this would result in a minimum to maximum energy difference equal to 40% of what would be obtained when all the material was in just the Stoner-Wohlfarth like pair. Hence, the magnetic response function would be more sensitive to the applied field as the minimum to maximum energy difference would be smaller for the total magnetic volume. This represents a method of adjusting the slope, also called the magnetic relative permeability, of the magnetic response function.

In many magnetic devices it is advantageous to have multiple thin film layers. Many times they need to magnetically or electronically interact and so there needs to be specifically anisotropy orientational relationships between them. For example, to minimize noise signal it is extremely useful to apply a controlling force along the easy axis of a magnetoresistive sensor in order to stabilize the device against the formation or motion of magnetic domain walls in the sensor material. This is sometimes accomplished by placing a hard magnetic material at the ends of a rectangular shaped device to provide a small magnetostatic field or to exchange couple to the soft film. Likewise, in these devices there is a need to bias the magnetization into a partially rotated state. This allows the magnetization to swing both positive and negative toward the hard axis and tends to avoid signal clipping or extreme non-linearities. In this anisotropic magneto resistance device the signal resistance varies with the orientation angle of the magnetization relative to the current flow direction. Hence, a second layer of controlled hardness or anisotropy, when placed in contact or proximity of the first layer, can provide these stabilizing or orienting effects. Likewise, in a spin valve or magnetic tunnel junction type magnetoresistive sensor the electron spin transport across an interface between the two stacked magnetic layers is effected via the S relative orientation of the two magnetic layers. R. C. O'Handley's text, "Modern Magnetic Materials and Principles and Applications" discusses the structures and mechanisms of these magnetoresistive effects as well as other magnetic applications. This technology is now well developed for field sensors, magnetic data storage playback heads and is rapidly being developed for Magnetic Random Access Memory (MRAM). When the magnetization of the two magnetic layers is aligned the electrical resistance is minimized as spin transport across the interface is enabled or enhanced. For example, sensing an external field is accomplished by pinning one layer against rotation while leaving the other free to rotate or designing a structure where the two films are antiparallel and both of them are allowed to rotate toward a common direction as the applied field is increased. When the two layers are not aligned the available conduction spin states are not common and the conductivity is minimized. In these types of devices a variety of orientation geometries have been discuss in the literature, but for all of these the signal always depends upon the field induced magnetization orientation changes between the stacked magnetic layers. In some device geometries there are multiple magnetic layers, more than two, and the magnetoresistance effect is determined via the conduction between the multiple film interfaces. Hence the signal determining applied field or magnetic state is determined by the field induced angle difference between the pairs of layers. Clearly, the incorporation of layers in which the anisotropy can be better controlled is essential to improving these types of devices. The uniaxial symmetry broken magnetic layer technology invented, and discussed here, is of considerable value for each of these devices. A third, hard magnetic layer structure, antiferromagnetic, or synthetic antiferromagnetic layer constructed from hard magnetic layers can be used to pin or exchange couple to one or more of the sensor magnetic layers. Control of the anisotropy of this layer is likewise of value in the device designs. By choosing the composition of two layers to have differing anisotropy constants one layer essentially appears hard to rotate while the layer with the lower anisotropy constant can appear to be magnetically softer and freer to rotate. Later in this application, we will discuss another method of using the uniaxial symmetry broken technology to orient hard disk magnetic media. This same approach can also be used to create or orient these hard or antiferromagnetic layer structures.

A new integrated circuit technology is emerging based upon the spin transport process and upon the orientation of magnetic layers similar to those just discuss. This technology is sometimes referred to as spintronics. The most simple of these concepts is a magnetic spin transistor whose conduction is a function of magnetic spins injected into a current controlling junction region. The current controlling concept is analogous to the carrier control or field control produced in a bipolar or field effect transistor. However, for spintronics, the orientation of a magnetic moment in the junction region of the device determines the spin dependent injection of the electronic carriers. Hence, control of the orientation and the magnetic state of these layers is essential. It is envisioned that transistors can be constructed as well as electronic logic and state devices. Furthermore, because with proper design magnetic states can remain after electrical power is removed, it is envisioned that these devices can possess memory functionality. These future electronic devices may come in unforeseen designs and functionallity, but one aspect is assured. Control of the anisotropy energy density and anisotropy orientation will be critical. The uniaxial symmetry broken mechanism can provide a methodology for controlling these angles and magnetic states.

Other magnetic circuit components, which can benefit from improved anisotropy control, include inductive properties. These are envisioned to include small traditional inductor geometries of magnetic materials in proximity of current carrying conductors. The permeability of the magnetic materials enable the additional storage of energy and so can be used to manipulate signal waveforms as in filters or to transfer or convert power to alternative voltage or current levels. Thin film structures would be especially useful at the microcircuit scale where high frequencies would normally eliminated the use of bulk magnetic materials. Both inductors and transformers are envisioned where serpentine pathways of layers of conductors and magnetic materials would be used to form the magnetic devices. The design needs to incorporate a considerable degree of magnetic flux path closure in order to achieve a reasonably high extrinsic permeability and, hence, efficiency. For linear signal transfer a near linear magnetic response is desirable, whereas for power transfer this is not as critical an issue. On the other hand, an analog signal mixer, as is commonly employed in radio communication, requires a non-linear response, which can be obtained from a uniaxial material via the easy axis response to a hard axis drive field in the presence of a bias field along the easy axis. However, important to each of these devices is that the magnetic losses be minimal. Otherwise the devices inject noise into the signal, tend to over heat as energy is dissipated in each cycle, and possess a limited frequency response. Clearly the uniaxial symmetry broken mechanism can provide a methodology for controlling the magnetic anisotropy and orientation and so enable these desirable device attributes.

Another magnetic field sensor, which utilizes the non-linear response function and benefits tremendously from a lossless process and high frequency operation, is known as the fluxgate. Fluxgates are commonly used to sense the earth's field and are extensively used in the well drilling process to monitor direction of the drilling process. This is especially important for deep well drilling such as in the oil industry where the cost of pulling the drill is quit significant. Having a robust field sensor to provide information for avoiding hitting certain materials is quite valuable. There are a number of physical designs for these devices. However, they all work on the simple concept of driving one magnetic axis and inductively measuring the time rate of change of the magnetization induced by the external magnetic field along an orthogonal axis. A non-linear response yields a signal, which is proportional to both the external field and drive frequency; and, is a second harmonic to the drive field frequency. Since the response is proportional to the drive frequency, the signal amplitude, for a small applied field, can be increase considerably via the use of a high frequency drive. However, if the material has losses the drive frequency is limited and if the losses are due to the Barkhausen phenomena associated with domain wall motion then the measurement sensitivity is also noise limited. If the magnetic material has a lossless uniaxial response, as obtained by a uniaxial symmetry broken structure, then device can be operated to higher frequencies and with better sensitivity to external fields.

Another family of magnetic devices can be used for article surveillance and article identification and are commonly referred to as tags. Some of these devices operate on the principle of non-linear response and others operate on the principles of linear response employing energy storage for later radiation. The control of the anisotropy energy density and direction is essential in each. The non-linear response devices typically allow the switching of the magnetic state abruptly via wall motion, which generated large amounts of harmonics of the driving field, which are then detected via picked up via electromagnetic sensing antennas. In the simplest manifestation the non-liear response tag is simply a strip of very soft magnetic material with a uniaxial anisotropy direction. This is easily produced utilizing our uniaxial symmetry broken material structures.

The linear tags work on the principle of coupling the magnetization orientation to the mechanical resonance of acoustic vibrations in the tag. This is done via the magnetoelastic properties, which is a complement property to magnetostriction, of the materials. For these materials a large magnetostriction coefficient is desired. When the magnetization is rotated away from the easy axis by a drive field along the hard axis the material either elongates or contracts depending upon the coefficient sign. This shape change is equivalent to an acoustic wave traveling along the tag. When the acoustic wave reaches the end of the material it tends to reflect backwards. Hence, if the tag is driven with magnetic field that oscillates with a period corresponding to the acoustic transit time between the ends of the tag, resonance is obtained. Likewise, if the drive field is fixed the length of the tag can be adjusted to match. For bulk material devices, where there is no substrate, the acoustic properties are determined by the acoustic properties of the magnetic material. However, if the magnetic material is laminated with another material or deposited upon a substrate then the acoustic propagation properties are determined by the combined properties of the magnetic material and the laminate or substrate. However, the acoustic resonance condition, of the combined set of materials, must still be matched to the magnetic field driving frequency. Tag detection occurs after the magnetic drive field is discontinued. Due to the acoustic resonance the tag continues to elongate and contract at the mechanical resonance frequency. Via magnetostrictive coupling to the acoustic vibrations the magnetization vector oscillates at the mechanical frequency, generating a magnetic field at the very specific mechanical resonance frequency, which can be detected by the detection antennas. As with the magnetoresistive field sensors the magnetoelastic tag device works best if a DC bias field is employed to tilt the magnetization from the easy axis. In this manner the magnetization vector oscillates about the bias point, which avoid frequency doubling and improves efficiency and sensitivity. For thin films, deposited on thin Si substrates, or very then substrates etched from Si structures, the high mechanical Q of the Si further improves the mechanical resonance process. A multitude of resonance frequencies can be utilized if substrates of different lengths are employed. The Micro-Electro-Mechanical structure, MEMS technology, is ideally suited to be incorporated in such a device when a multitude of unique tags are desired. Resonance beams of various lengths can be micro-machined on to a single substrate for a single device. The magnetoelastic material deposited on to all of the beams. Just as with electronic circuit technology many of these devices can be processed on a Si wafer in parallel. When this device is driven by an oscillating magnetic field only those beams with the length corresponding to the driving field frequency vibrate and store energy. By sweeping the drive frequency and then electronically listening via an antenna for the radiated magnetic field response each of the beams sequentially, or by applying an impulse field and then observing the various response frequencies, a very unique signal signature can be obtained. Various acoustical MEMS structures can be designed to allow a generic MEMS structure, which can be programmed after the devices are constructed. For example, via mechanical dampening of predetermined beams of specific lengths of a given device, a unique signal signature can be obtained. Hence, from a single MEMS processed Si substrate thousands of unique tag devices can be constructed. Hence, it is conceivable to label each product with unique tag device, each with a unique signal signature. Critical to any of these devices for operation is the control and orientation of the uniaxial magnetic anisotropy energy. The unaxial symmetry broken magnetic material structure is ideal for this application.

Also, as discussed earlier, in hard disk media it is potentially valuable to have a soft keeper layer in close proximity to the hard media layer. By using a uniaxial material and controlling the orientation of this layer relative to the recording track, and to the preferred direction of the hard memory layer, can yield improved areal densities via improved media noise, SNR, PW50, thermal stability, and overwrite properties. We have also found that the use of the orientation determining bcc-d variants as an underlayer can result in some control of the orientation of the hard magnetic layer.

By investigating the epitaxial growth of various film stacks on single crystal substrates we have found that there are some unique epitaxial relationships that have heretofore not been invented or utilized, as well as, some which enable unique characteristics when combined with the newly invented coupled variant structures.

We investigated three Si crystal substrate texture orientations, (100), (110), and (111) by first depositing epitaxial Ag on to these cleaned surfaces. Some epitaxial relationships are already known from U.S. Pat. No. 6,248,416, Heng, Zangari, and similar publications where, for example, the growth of Cu(fcc) on Ag(fcc); permalloy(fcc) on Ag(fcc) or Cu(fcc); Co(fcc) on Cu(fcc) or permalloy(fcc); Cr(bcc) on Ag(fcc); Ti(hcp) on Ag(fcc); or Co(hcp) on Cr(bcc) or Ti(hcp) were studied extensively. However, nowhere in these works was any evidence presented of depositing bcc-b magnetic materials nor of the observation of any symmetry broken structures disclosed. We have observed symmetry broken structures by applying symmetry breaking methods and controlling the deposition process conditions. For example, we have used both deposition in an applied field and deposition at an angle on highly oriented hexagonal templates to obtain highly textured symmetry broken iron, iron compounds and iron alloys.

Also, we have found, as has been disclosed in the literature, that we can epitaxially grow one bcc-d on another and again on another while maintain the strong texture and orientational relationships between each of the bcc-d on each of the three Si crystalline textures, <100>, <111>, and <110>. There are also other relationships. Epitaxial fcc Ag, Au or Al always forms the same texture as the Si substrate surface. On this fcc-d substrate, a number of epitaxial relationships can be obtained for the following layers. Upon these layers yet other epitaxial relationships are formed. When a bcc-d is grown on another bcc-d the same texture results. When fcc-d is grown on fcc-d the same texture results. However, when bcc-d materials are epitaxially grown upon, denoted by "/", fcc-d materials of a give texture the following texture relationships result:

bcc-d texture/fcc-d texture
(100)/(100)
(110)/(111)
(112)/(110).

When fcc-d materials are epitaxially grown on bcc-d the following texture relationships result:

fcc-d texture/bcc-d texture
(100)/(100)
(111)/(110)
(110)/(112).

When hcp materials, such as Co alloys, are epitaxially grown on bcc-d the following relationships result:

hcp texture/bcc-d texture
(11$\underline{2}$0)/(100)
(10$\underline{1}$1)/(110)
(10$\underline{1}$0)/(112).

When Ti is epitaxially grown on fcc the resulting Ti is hcp and the following texture relationship can resulted:

hcp Ti texture/fcc texture
(0002)/(111).

However, the bulk phase diagrams of Co alloys show both an hcp phase at low temperatures and an fcc phase at somewhat higher, but not extreme, temperatures and so it is possible to grow either hcp or fcc Co. When grown on an fcc underlayer we found the epitaxial Co to most commonly form the fcc phase and texture of the underlayer. Hence, it behaved just as other fcc-d materials deposited upon fcc-d templates. However, when formed on bcc-d it formed the hcp phase and the texture relationships noted above resulted. When Co is epitaxially grown on another hcp it is hcp and has the same texture and orientation as the underlayer hcp.

In each of these cases, except for the case of the six bcc-d variant structures under discussion, the in-plane orientational relationships were as denoted in U.S. Pat. No. 6,248, 416, and publications by Heng and by Zangari. However, we have invented some new relationships involving oxides, which enable the construction of new devices. For the three fcc metals, Cr, Fe, and Al; and for selected alloys of these, we have found that the surface of the metals can be formed as oxides and then when the same metal is then deposited upon this surface oxide the second metal layer sometimes epitaxially grows and assumes the texture and in-plane orientation nearly as though the first metal layer had not been oxidized. This statement was found to be true for all three of the Si substrate textures investigate. However, the Si(111) is the most stable agains oxidation followed by Si(100) followed by the least stable S(110). And so when growing epitaxial films, by our current techniques, usually the films that develop on Si(111) are of the highest quality and their resulting textures of the following layers are also of higher quality. Hence, they are also the easiest to analyize. Because of the high degree of texture and lack of large angle grain boundaries, when these metals are exposed to oxygen they appear to passivate uniformly with a thin oxide layer and then cease to be consumed into oxides. It is estimated that even for a reasonable exposure to atmospheric conditions the oxides can be as thin as 1 to 3 nanometers, but could also be grown thicker by direct epitaxial oxide deposition or with the addition of heat or moisture during a post deposition exposure to oxygen. While extremely thin and difficult to measure each of these oxides may form the rhombohedral corundum crystalline phase commonly designate as prototype $\alpha$-$Al_2O_3$. Interestingly enough $\alpha$-$Cr_2O_3$ and $\alpha$-$Fe_2O_3$ form a continuous solid solution. It was found that when the first metal was a Cr alloy, then oxidized, and the second metal was Fe, that the second metal formed, to a limited degree, the same texture and orientation as the first. The same was true when the Fe was the first metal and the Cr was the second. However, when the Fe was oxidized on its surface many of its magnetic properties were degraded. In addition, there are many additional elements that can be added to Cr, Fe, or Al and then be oxidized into the same crystal structure. For example, both $\alpha$-$V_2O_3$ and $\alpha$-$Ti_2O_3$ phases exist. The $\alpha$-$V_2O_3$ forms a solid solution with $\alpha$-$Fe_2O_3$. Also limited amounts of Al can be added to Fe and the $_\alpha$-$Al_2O_3$ crystalline structure still results when oxidize. Likewise, it is known that $FeTiO_3$, $MnTiO_3$, $CoTiO_3$, $NiTiO_3$ can be added to $_\alpha$-$Fe_2O_3$. There are a large number of other metals that in small quantities can be added to the Cr, Fe, or Al and when oxidized still result in the $\alpha$-$Al_2O_3$ structure. However, it should be recalled that in our samples the oxide is very thin and it was difficult to determine the exact crystal structure. It is possible that more than one oxide structure can pass the texture and orientation of the first metal layer to the second. Fe and Cr both also form the cubic spinel structure, $A_1B_2O_4$, and there are many transition metals, and combinations of metals, that can be added to these to still form the spinel. There is also the possibility that the oxides formed are more than one crystal structure. $CrO_2$ is a tantalizing possibility as its nearly half filled conduction band is essentially half filed with a single magnetic spin orientation and so holds tremendous potential in a spin valve or tunneling structure. The corundum, however, is an excellent candidate for the oxide due to its stability and is commonly known to form on Fe, Cr and Al metal surfaces. While amorphous oxides also form, it is hard to believe that the strong texture could be passed from one metal to the other via an amorphous oxide.

Furthermore, for the <110> bcc-d texture, we have found that the texture of the six variants discussed propagates the variant crystalline orientations if one bcc-d is place directly on another metallic bcc-d or if it was placed upon the oxidized surface as just discussed. Hence, it is possible to develop a first symmetry broken uniaxial bcc-d layer, epitaxially grow a second symmetry broken bcc-d layer, oxidize it, and then grow yet another bcc-d layer on the oxide with the same texture as the first bcc-d. Some interesting magnetic arrangements can be constructed from these layer-to-layer texture relationships. If the two variant sets that have been epitaxially grown on top of one another, and have anisotropy energy constants of the same sign, then the easy axes are aligned. However, an interesting case arises if one layer has a positive and the other a negative anisotropy energy density constant. This results in the two layers having easy axes at 90 degrees to one another. This means that one orientation can be induced by the symmetry breaking mechanism and then by using a bcc-d with the opposite anisotropy constant sign the easy axes of the second layer is rotated 90 degrees with respect to the first bcc-d layer even without the use of a process that would normally be required to break the symmetry of the second bcc-d film. Furthermore, the thickness of a non-magnetic bcc-d layer, which can be placed between these two magnetic layers, can be used to adjust the magnetic exchange coupling between the layers. This can be adjusted from being strong to weak as this non-magnetic layer is made thicker. Adjusting this non-magnetic layer thickness and the thickness-saturation magnetization product of each of the two magnetic layers adjusts both the angle between the magnetization vectors and the in-plane orientation of the two magnetic layers. Hence, because exchange coupling strength between the two magnetic bcc-d layers a can be controlled by selecting the coupling material or by controlling the coupling layer thickness the net magnetic easy axis orientation of the coupled film structure can be selected. These features are useful in a variety of magnetic device designs as they allow the angle between the two magnetic layers, as well as the stiffness to changes in the angle, to be varied without the use of an additional hard or anti-ferromagnetic layer. This type of behavior is of use in device construction such as spin valves or spend dependent tunneling devices.

We also found that a strong (111) fcc-d texture develops when grown on the six variants of the bcc-d. Furthermore, the in-plane orientation assumes the same direction as the underlying hexagonal (hex) template. Hence, a layer structure such as bcc-d(110)/fcc-d(111)/bcc-d(110)/hex(111)/Ag(111)/Si(111)

is viable, where either, or both, of the bcc-d layers are symmetry broken by the use of the symmetry breaking mechanism. (Here we use the notation that the film on the left of the "/" is deposited after the film on the right of the "/". From the tilt angle of the "/" it is easy to recall which layer is on top.) Of course this approach also applies when the substrate is polycrystalline via the grain orientation averaging process. Furthermore, when both layers are made uniaxial, the easy axes of the two magnetic bcc-d layers can be adjusted relative to each other by using the symmetry breaking mechanism at different angles for each layer. In another, example, a multiple layer epitaxial uniaxial layer structure can be formed as bcc-d/Cr/O/Cr/bcc-d/hex(111)/substrate.

Again, here, the "/" symbol denotes a layer change, while the "O" layer represents the exposure of the prior film surface to oxygen or air. The bcc-d layers are magnetic, (110) textured, and symmetry broken. This Chromium example represents a non-magnetic bcc-d material that is epitaxially grown on the magnetic bcc-d layer and allows an oxide layer that does not contact the magnetic layer. This structure allows the two magnetic layers to be electrically insulated from each other via the oxide layer and yet uniaxial behavior is obtained by utilizing the symmetry broken structure. Implied in this structure, but not shown, are the variant exchange coupling materials or layers. For example a magnetic hex (111) layer. In fact, it is not uncommon that the hex (111) layer structure is composed of more that one layer. Likewise, an fcc-d magnetic variant coupling layer, such as NiFe, can be placed on top of the final bcc-d layer.

For very thin oxide layers spin dependent electrical tunnel conduction devices have been constructed as a large effect magnetic field sensor. These devices, just as with the spin valve device, rely upon the electronic transport being sensitive to the relative orientation of two magnetic layers. However, in tunneling devices the current is directed perpendicular to the film plane and tunneling must occur through the oxide. Traditionally, these are usually constructed from fcc Co or permalloy magnetic layers with an Al oxide insulator layer. The use of an Al oxide as the insulator is widely published upon. However, deposition of the oxide has been hard to control and oxidation of a deposited, very thin polycrystalline Al oxide layer usually results in conduction pin holes. Sometimes the Al has been deposited as a metal and then post oxidized, but because of the limited quality of the underlying metal texture uniformity of the polycrystalline oxide is still a problem. The oxide layer thickness should only be about 1 to 2 nanometers in order for the tunneling energy barrier to be a reasonable value. Clearly the highly oriented films used to make the oxide structure listed above, where the Al is used to replace, or in addition to, the first Cr layer would benefit the spin dependent tunneling device. This is especially true when constructed upon the single crystal Si substrate. The uniaxial properties of the symmetry broken structure enable a considerably simpler device or construction process to be developed.

Yet another, example, of a multiple epitaxial set of layers allows both an oxide insulator, O to separate a conductor, such as fcc Ag or Cu, from the two magnetic layers bcc-d/Cr/O/Cr/Ag/Cr/O/Cr/bcc-d/hex(111)/substrate.

For brevity, the texture and orientation relationships are not shown, but are understood to exist as discussed above. When the Ag conductor carries a current, the two magnetic bcc-d layers guide the magnetic flux generated in a close path around the conductor (e.g. Ag). In this configuration each or both magnetic layers may be uniaxial with anisotropy directions equal or different. Providing the relative magnetic permeability is greater than one and that lithographically defined current paths have been constructed this represents a compact electronic thin film inductor; and with the use of additional conductors and magnetic layers multiple turn electronic transformers can be constructed. Inductance is proportional to the magnetic relative permeability. We have found that relative permeabilities exceeding 10 are quite viable and in some structures exceeded several hundred in our uniaxial, symmetry broken bcc-d film structures. Furthermore, for thin metallic magnetic films the maximum operational frequency is either determined by the ferromagnetic resonance frequency or by eddy currents, if the structures are made thick. Our modeling indicates the it is quite reasonable to expect operational frequencies of a few Gigahertz using Fe or Fe alloys. For uniaxial materials the resonance frequency is proportional to the root of the cross product of the saturation magnetization, $M_s$, and the anisotropy field, $H_K$. For linear uniaxial materials $H_K=2K_u/M_s$.

Hence, the ferromagnetic resonance frequency is proportional to the anisotropy energy density, while the permeability is related to the inverse of this. For thicker films where the operational frequency might be limited by eddy currents, making chemical additions of only a few percent of secondary materials, such as Si, N, C, or Al to Fe or FeCo can increase the resistivity substantially. For example 3% Si by weight in Fe results in a 5 fold decrease in conductivity. The penetration depth, or skin depth, of eddy currents is inversely proportional to the square root of the inverse permeability-conductivity-frequency product. Our estimates indicate that for the proposed geometry that the thickness of the magnetic layer will have to approach one or microns before the eddy currents limit the operational frequency. Hence, inductors, transformers, and sensors made utilizing these symmetry broken material structures should function in the Giga Hertz range.

It should be stated again that due to the variety of symmetry broken coupled variant sets and the fact that epitaxial growth should be viewed as happening on each individual grain of a polycrystalline material these texture relationships and the device concepts apply to both polycrystalline film structures and single crystal structures prepared on single crystal substrates such as Si. Likewise, other single crystal substrates can be used to produce the uniaxial symmetry broken thin film structures with exceptionally strong texture orientation, such as the commonly available Ge anb GaAs, can be used provided that the texture is chosen to present the hex (111) template and that epitaxial thin film grown is obtained.

Yet another example of a device that can benefit from the symmetry broken structure is the growth of magnetic recording media. Here the hard magnetic layer is usually composed of hcp Co alloys such as CoCrTa, CoCrPt, CoCrPtTa, CoCrPtB, CoCrPtCuB and the like. In each of these the desired crystal structure is hcp to enable a high anisotropy energy density constant. Traditionally, hcp Co is grown on Cr or Cr alloy underlayers to control the crystalline texture and disk substrate is mechanically textured (scratched) along the recording direction to achieve a preferred orientation ratio to be greater than one, when compared to that perpendicular to the recording direction. Having a hard disk recording media oriented preferential along the recording direction results in a higher coercivity and better thermal stability. It is well documented that upon a Cr (110) textured underlayer hcp Co alloys develop (10$\underline{1}$1) crystalline texture. The texture is referred to as the Co alloy quad-crystal because there are four possible c-axis orientations on a single crystal Cr grain with (110) texture. This is not the ideal hcp texture because the hcp c axis, which is the magnetic easy axis, is tilted in or out of the film plane by about 28 degrees. Nevertheless, this texture has been used extensively for media and if it were oriented along the recording field direction it would be of considerable benefit. Because of the demagnetization field of thin films the magnetization vector lies in the projection of the c-axis into the plane of the film. This then reduces the possible number of in-plane projections of c-axis orientations on a single Cr (110) textured crystallite to two. They are at angles of + and − the $\arctan(1/\sqrt{2})=35.26$ degrees with respect to the bcc-d <100> directions. If one considers the bcc-d coupled variant pairs as template underlayers for epitaxial Co alloy growth then the symmetry broken films provide a template with preferred direction for the Co alloy to grow upon. This technique of selecting a textured and oriented underlayer provides a pathway to achieve hard disk oriented media.

Consider, the coupled variant pair, $E_{2-a1c2}(\theta)$. This symmetry broken coupled variant pair has the its <111> crystal lattice directions, that are parallel to the (111) hexagonal template <110> directions, along the θ=60 and 120 directions. From FIG. 5 it is easy to see the <100> directions of the two bcc-d cells. When a Co alloy quad-crystal is grown, the projection of the c-axis is approximately at +40.3 or −40.3 degrees with respect to the bcc-d <100> direction.

Figure 12:
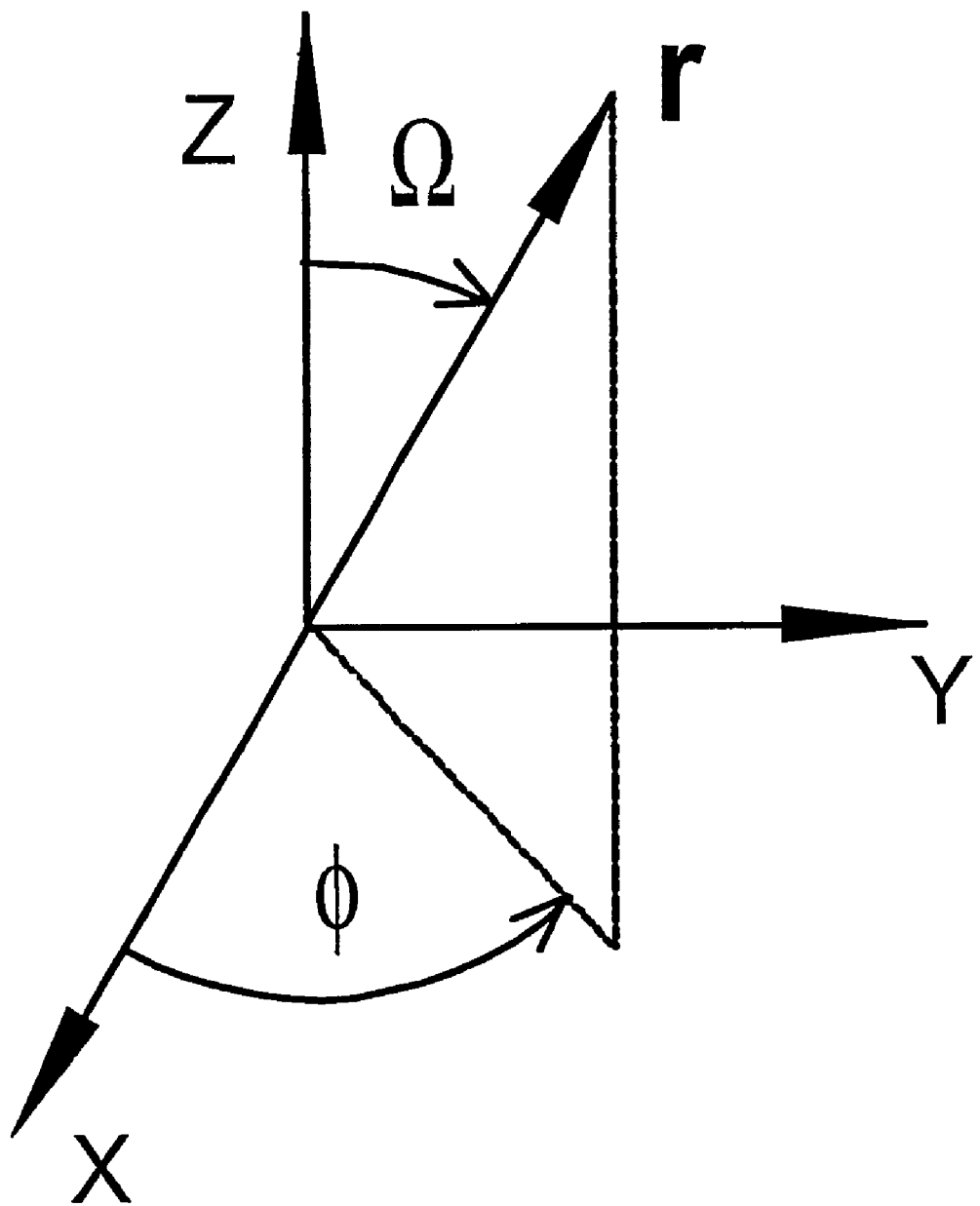
FIG. 12 shows a sketch of the coordinate system for defining the angle of atomic motion during angle of incidence deposition. The substrate plane is x-y and the depositing materials arrive along r. The angle of deposition, ω, is defined as the angle between the z-axis and r vector.

Table 1 lists all of the possible quadcrystal structure Co alloy in-plane easy axes directions when grown on all of the six possible bcc-d variants discussed. An ideal, hcp c/a=2√(2/3)=1.63, crystalline unit cell was assumed for these angle calculations. As an example to understanding the calculations in Table 1 consider the first variant, $a_1$. The <100> direction is listed as 65.26 degrees in FIG. 5. Hence, the two in-plane Co c-axis projections would be at approximately 105.6 and 25.0 corresponding to the + and − entries in the first row of Table 1. Considering only the two variants of the symmetry broken $E_{2\_a1c2}$ coupled variant of FIG. 5 one can predict the Co alloy magnetocrystalline anisotropy directions which will be selected from those of Table 1. These two bcc-d variants, whether coupled or not, would induce the eight possible Co alloy variants associated with obtaining two quadcrystals. There would be four for each of the two a1 and c2 bcc-d variants. However, because the out of plane demagnetization forces would drive the magnetization vector into the thin film plane, the four c-axes projections in the film plane would be 105.6 and 25 degrees for $a_1$ and 155 and 74.4 degrees for $c_2$. Since the later two are closer to the 90 degree direction than the first two are to the 0 degree direction the net coercivity along the 90 degree direction is higher than that along the 0 degree position. Clearly, the recording tract should be oriented along the 90 degree direction to obtain an magnetic orientation ratio greater than one. Unlike the soft magnetic films it is desireable, for good SNR, that the four possible hcp cobalt orientations be individual grains, which are decoupled. For this reason it is best if a non-magnetic symmetry broken bcc-d provide the template for the Co alloy to grow. However, a magnetic bcc-d symmetry broken template can first be grown and then the non-magnetic variant template can be epitaxially grown on this. As discussed earlier, while not necessary in all media structures it may also be desirable to have a soft magnetic keeper layer below the oriented hard magnetic layer. The ideal easy axis direction for the keeper would be perpendicular to the recording track so that the stray fields from the recorded bits drive the keeper layer magnetization along its hard axis. However, the easy axis for the $E_{2-a1c2}$ example is also at the 90 degree position. As discussed earlier however, it is easily reoriented to the 0 degree position by choosing a material with a $K_1<0$. Due to the manufacturing constrains of a circular disk, the preferred symmetry breaking method is to deposit the bcc-d material radially on the round disk surface and at an angle relative to the substrate normal. Our findings are that a symmetry broken structure can be obtained even for polycrystalline films provided the (111) hexagonal template is highly textured and the deposition angle with respect to the substrate normal is constrained to be within $15 \leq \Omega \leq 75$ degrees from the normal. The incident angle is shown in FIG. 12, where the arriving bcc-d material travels along −r, which is at an angle Ω with respect to a normal (z) to the substrate plane (x-y). When the deposition material arrives at grazing angle, 75 degrees, the efficiency of deposit decrease, but the symmetry breaking method is very effective. When the deposition angle is near the normal, 15 degrees, the deposition efficiency is superior but the symmetry breaking tends to diminish. The application of a magnetic field is also very effective symmetry breaking method, but a bcc-d layer with K1>0 and a field directed along the track direction to achieve the $E_{2\_a1c2}$ are required. Due to the standard manufacturing process of simultaneous deposition of materials on both sides of the disk a radially directed or circumferentially directed field is not very conducive to incorporation in to modern hard disk media manufacturing process.

TABLE 1

| Variant name | bcc-d <100> direction angle relative to template. θ = 0, <110> direction. | Two in-plane projected QuadCrystal projected c-axes angles relative to template <110> direction, θ = 0. | |
|---|---|---|---|
| | | + | − |
| a1 | 65.264 | 100.529 | 30.000 |
| a2 | 54.736 | 90.000 | 19.471 |
| b1 | 5.264 | 40.529 | −30.000 |
| b2 | −5.264 | 30.000 | −40.529 |
| c1 | 125.264 | 160.529 | 90.000 |
| c2 | 114.736 | 150.000 | 79.471 |

Also, we found that by first depositing a metal wetting layer on a typical hard disk substrate surface that strong (111) texture could be obtain. The increased atomic surface mobility provided by the wetting layer allows the close packed texture to form from a hexagonal template material such as fcc Ag, Cu, Ni, NiFe or even a hcp Co alloy. A non-magnetic Co alloy of $Co_{1-x}Cr_x$, where $25_{at\%} > x > 50_{at\%}$ is preferred if exchange coupling of the bcc-d is not desired. It was found that a deposited amorphous metallic layer provided an excellent wetting layer.

In particular, in any application where a wet layer was desired, a amorphous compositions of NiP or materials that under bulk material equilibrium conditions would form C15 or C14 crystal structures seem to form excelled amorphous wetting layers when vacuum deposited. Examples of the C15 and C14 structures are $Cr_{1-x}Ta_x$ and $Cr_{1-x}Nb_x$, or $Fe_{1-x}Ta_x$ and $Fe_{1-x}Nb_x$ where 55<x<75 atomic percent. It is noteworthy that in the Cr—Ta alloys the equilibrium phase diagram shows a high temperature to low temperature phase transition from a crystal structure of C14 to C15. It is believed by the author that the pairing of these complex equilibrium crystal structure enhance the propensity for an amorphous film to form in the non-equilibrium thin film deposition process. In each hexagonal atomic template material case, fcc-d or hcp, the use of these amorphous layers resulted in strong, (111) or (0002), texture respectively. In the case of these two C15 materials it was found that they could be exposed to oxygen and a reasonably strong texture still developed. Hence, the grain sizes of the hexagonal template layer and following layers could be made smaller in a process controlled manner.

Figure 13:
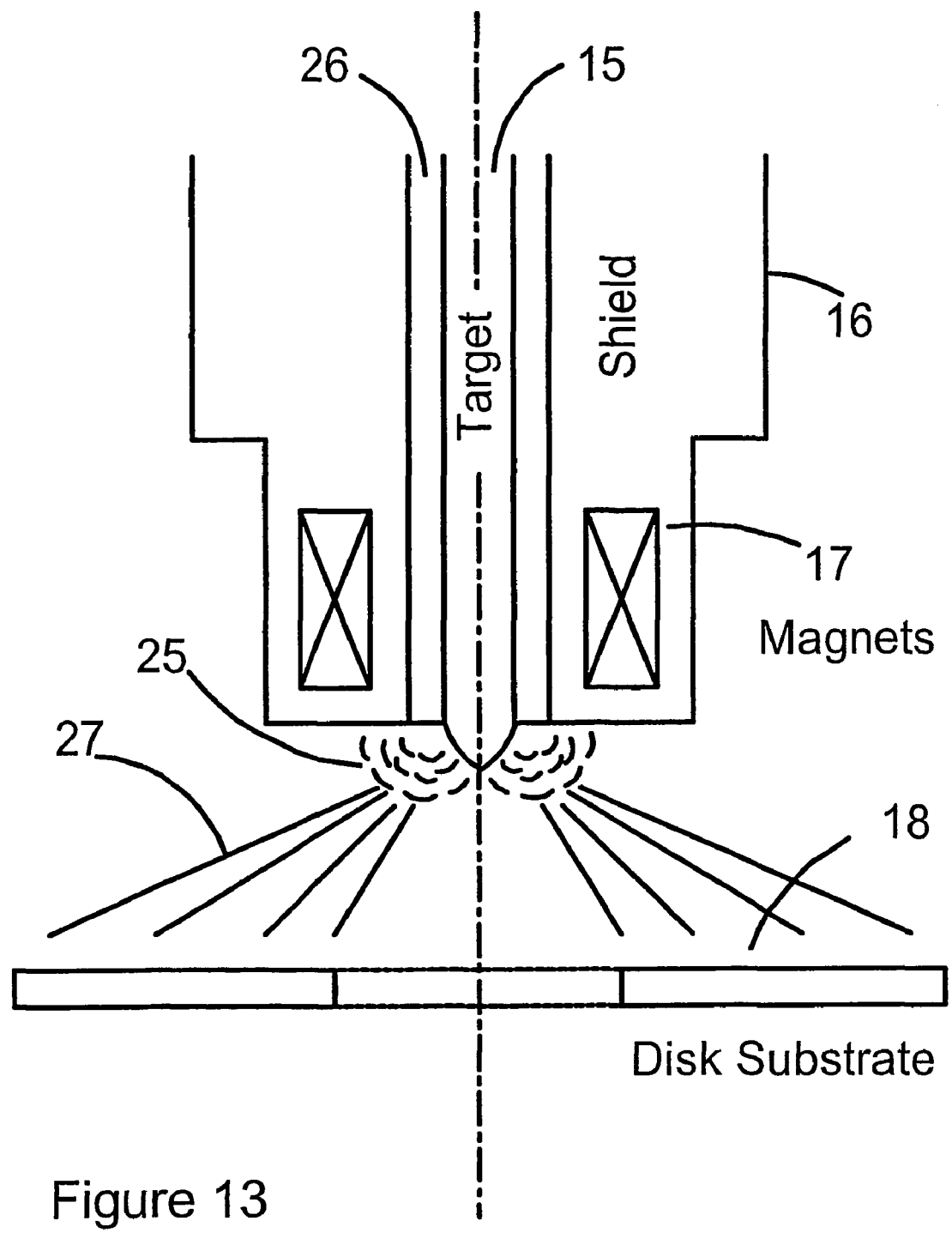
FIG. 13 is a schematic illustration of a new sputtering cathode geometry relative to a disk surface for angle of incidence deposition.

While a cylindrical geometry is not needed for magnetic media that is not to be used in a disk format, it is needed for modern hard disk media. In order to achieve uniform and symmetric deposition, with preferred magnetic orientation around a disk substrate structure, a new vacuum sputtering cathode was devised. FIG. 13 illustrates a cross-sectional view of a rod shaped sputtering target [15] composed of bcc-d material for deposition on to a disk substrate. A shield [16] and magnets [17] to facilitate a sputtering plasma at low Ar gas pressures surround the target. A disk substrate [18] is held on axis with the sputtering target, but at a distance to cause the sputtered material [27] to arrive at the disk surface along a radial direction and at an angle of incidence. Ar gas is introduced into the vacuum chamber via a pathway [26] between the target and a water cooled shield. This concentrates the sputtering gas [25] in the vicinity of the sputtering target and minimizes it in the vicinity of the disk substrate. The sputtering gas also provides a cooling mechanism to transfer heat from the target to the water cooled shield. A low gas pressure is desired to enable a scattering mean free path of the sputtered material to be comparable to, or longer than, the distance from the target to the disk substrate. This prevents the randomization of the direction of the sputtered material by avoiding gaseous collisions. Sputtering wears the target in a predefined and somewhat conical shape causing a deposition path from the target to the disk at the desired range of incident angles between 15 and 75 degrees. However, it has been found that a more narrow angle distribution centered about 45 degrees is preferred. The target rod diameter is small compared to the desired inside disk recording diameter and so the material leaving the target essentially follows a radial path toward the disk at all locations on the disk surface. In combination with the target surface profile shape, the disk to target distance is adjusted to set the deposition angle. To avoid non-uniformity produced by the magnetic fields of the sputtering cathode magnets the magnet structure may be rotated around the target rod during the deposition process. While not needed for this current work it is envisioned that the target wears smoothly to a somewhat conical point allowing the target to be advanced, relative to the magnets, toward the disk center along a normal path from the disk surface and center during the deposition of any one disk. This allows for adjustment of the deposition angle and deposition rate at various positions along the radius of the disk. Likewise, the advancement of the overall position of the target relative to the magnets allows for continuous replacement of the worn target. This allows deposition on to many disks before the vacuum must be opened to replace the consumed targets. An interesting benefit arises from spinning the sputtering magnets around the target. The magnetic fields from the magnets can be so arranged to provide a small, but non-negligible, magnetic field at the disk surface directed around the circumference of the disk. This directionally provides, a second symmetry breaking mechanism, in addition to the deposition at an angle, an energy mechanism of deposition in a magnetic field to help promote bcc-d orientation of the magnetic material. For magnetic bcc-d material with K1>0 the promoted easy axis from both symmetry breaking mechanism coincides.

Methods and structures to obtain an oriented hard Co alloy using the symmetry broken structures have been invented. It is also clear that these can be used to pin, via exchange coupling, the soft magnetic layers in many of the magnetic devices utilizing a soft magnetic layer.

To further confirm the information already described in this invention description a selected set of physically constructed materials and the analysis of these materials will be described in more detail.

A large number of thin film sample structures were fabricated and analyzed. Four types of substrates were initially utilized: Si(111), Si(110), Si(100) and glass. The substrates were carefully cleaned via intensive washing with solvents such as acetone, toluene, and isopropyl alcohol and then washed with detergent and hot water. They were then rinsed extensively with distilled water, isopropyl alcohol, distilled water and were blown dry. This removed all organic residues, water and most extraneous metals from the substrates. The Si substrates were then etched for approximately 30 seconds in 49% Hydrofluoric acid and blown dry. The substrates were attached to a carrier and were quickly introduced into the vacuum system via a load lock system. The HF etch of the Si is well known to leave a residual hydrogen bonding on the Si surface and temporarily prevent oxidation. The vacuum deposition system was both cryogenically and turbo-molecularly pumped. A vacuum base pressure of $1 \times 10^{-7}$ Torr or better was commonly obtained. Via a vacuum manipulator, the substrate carrier was attached to one of three heated carrier positions to await thin film deposition.

The substrate carrier mount facilitated approximately a 7-inch radius planetary motion in a vertical plane. There were three possible positions for the substrate carriers to be mounted; two on the planetary circle and one in the center on the planetary axis. Four magnetron sputtering target positions allowed up to four different materials to be deposited at various angles of deposition, each multiple times if needed, during one deposition sequence. Three targets were arranged along the edge of an approximately 7-inch radius circle, which was aligned with the planetary positions of the substrate carrier positions. In this manner the three targets and the two concentric substrate holders could be brought into alignment to face each other for normal angle deposition or the substrates could be rotated into any arbitrary position on the planetary circle for angular deposition. For example, one target could be located at the equivalent position of three AM on the face of an imaginary clock and the substrate carrier, which was spaced an adjustable distance along the normal to the planetary plane, could be rotated to any position on the opposing imaginary clock face. The substrate carrier could be move away or toward the targets over approximately a 7-inch swing, with a minimum spacing of less than 2 inches. The fourth target was located at the center of the planetary motion axis and in a plane with the other targets. Likewise, the third substrate carrier position was located at the planetary center in the substrate carrier plane. The carriers could be moved from a planetary position to the center and back via the mechanical manipulator in a time frame of less than one minute allowing layer to layer epitaxial growth.

The one and two inch diameter targets were usually small compared to the distance between the targets and the substrates. In a similar manner to that discussed for FIG. 13, the Argon gas was introduced at the target surface allow a plasma while increasing the mean free path length in the rest of the chamber, and so to limit scattering, of the depositing material. A secondary gas flow such as N or H could also be introduced via the same path or another to allow interaction with the deposited layers. Each substrate carrier position was independently heated and monitored and the temperature could be varied from room temperature to about 350 degrees C. Except when experiments were performed on multiple substrate textures simultaneously, the temperature was selected to optimize the process for the particular single crystal substrate texture chosen. The substrates were heated prior to and during the deposition and to a limited degree the temperature could be changed as each layer was deposited. The sputtering cathodes were DC powered with up to 500 watts available. The physical dimensions when a bcc-d was deposited from the center cathode to a substrate that was on the planetary circle allowed angles of deposition ranging from 75 to 33 degrees measured from the substrate normal. For smaller angles the substrate was mounted at 45 degrees to the substrate carrier and then the target to carrier angle was adjusted. Also, under some circumstances deposition at smaller angles could be accomplished by using a target and substrate position both on the planetary circle, but with the substrate rotated relative to the target. Of course the distance between the target and the substrate could also be adjusted, but this did create a potential difference in deposition rate.

While a large number of deposition conditions were investigated it was soon found that working with layers that were 20 to 100 nm thick facilitated easier optical, magnetic and microstructure analysis. Hence, most of the bcc-d films were prepared at 20 nm to 200 nm thickness. Most of the Ag layers on Si substrates were 40 nm thick and sometimes a second Ag or Cr layer or both was deposited as a final capping layer to prevent corrosion of the magnetic layers. Hexagonal template thickness varied and could be as thin as 1 nm and were made as thick as 40 nm. Typically a magnetic exchange coupling hexagonal template was kept minimally thick, 1 to 5 nm so that the bulk magnetic properties were not significant compared to the bcc-d magnetic properties. This facilitated easier interpretation of the magnetic data.

Commonly investigated materials included: Ag, Cu, Ni, NiFe, Al, Co and CoCrTa, which are fcc; Cr, Fe, Nb, NiAl, FeCo, which are all bcc-d, and Ti and CoCrTa, which are hcp.

Other bcc-d materials, which may be used to alloy with Fe or FeCo include W, Mo, V, Cr, Ti, Ta, Si, Al, N, Cu and B. Other fcc-d materials, which may be used include CoCr, Au, Pt, Rh, Pd, and Ir, while other hcp materials, which may be used includes Re, Ru, Gd, Ti and Tb. The materials of choice are chosen for there chemical, magnetic, or lattice matching properties. Considerable flexibility in atomic lattice constant is sometimes desirable to achiever epitaxial growth.

The following example notation will be used to designate the sequence of film layers that were prepare:

bcc/hcp/bcc-d/bcc-d<55,<xyz>/hex/fcc/Sub(tex).

Again, the notation is that the film on the left of the "/" is deposited after the film on the right of the "/". From the tilt angle of the "/" it is easy to recall which layer is on top. The "tex" symbol represents the single crystal substrate texture used. The <55 represents the angle that the bcc-d is deposited and the number specifies the angle from the film normal. In general when used, the < symbol represents that a symmetry breaking mechanism is being employed. Likewise, if a magnetic field, $H_a$, is used to break the symmetry then the field is applied along the hexagonal crystal direction <xyz>. Likewise, when an angle of deposition is used to break the symmetry the in-plane direction of deposition material is also denoted to follow the <xyz> crystal direction.

Hence, as written in the example expression immediately above, fcc would be first deposited on the substrate at a normal angle, then the hexagonal template would be deposited at a normal angle, then at an angle to the plane normal of 55 degrees and parallel to the hex template <xyz> direction the bcc-d would be deposited. Then a second bcc-d would be deposited, then an hcp would be deposited and finally a bcc would be deposited last. If a surface was oxidized by exposure or an oxide was deposited then we would write that layer as a "O".

U.S. Pat. No. 6,248,416 and the Gong and Zangari publications demonstrated that the textures and epitaxial relationships mentioned earlier could be grown on Si. This invention relates to the growth of six bcc-d variants rather than three, as was found by U.S. Pat. No. 6,248,416 and Gong and Zangari, the exchange coupling of the variants, and in the symmetry breaking of the coupled variant sets so that they do not have equal variant volume weighting. That is, to obtain symmetry breaking, the three variants, in the Gong and Zangari publications, or the six variants, as describe here, are not balanced.

We first investigate the epitaxial growth of the bcc-d textures even though the surface of the first metal, when exposed to air, has formed an oxide. The key for this aspect of this invention to be assured is that the underlying crystallinity of the film exhibits extremely uniform oriented texture and, while we do not address it here with physical evidence, we believe this leads to the underlying film being very dense. When a film has extremely high texture, then for some textures the grain boundaries are of low angle or there is little space between the grains. This assures that the film surface tends to passivate rather than oxidize down the grain boundaries to force the film from the substrate via expansion. This is extremely important for polycrystalline materials like Fe, which tend to oxidize badly.

First we provide a perspective for the degree of texture obtained by observing a θ–2θ x-ray diffraction scan of a conventional polycrystalline film structure:

Hcp-CoCr$_{12}$Ta$_2$/Cr/glass

This is a classic, but simple structure sometimes sputtered for hard disk media. Upon examination of the X-ray scan we found that two peaks exist. Cr(110) had a peak height of about 150 counts and the resulting Co-alloy quad-crystal (10$\bar{1}$1) peak height of 25 counts and a uni-crystal (10$\bar{1}$0) peak height of 40 counts resulted. The base line was rather noisy and there were no other discernable peaks. We use the same scan time and X-ray anode current and voltage for all of the θ–2θ X-ray diffraction scan examples to be discussed.

Four samples were made simultaneously each with a different substrate: glass, Si(100), Si(110), Si(111) where the Si was cleaned and HF treated as mentioned before. They were introduced into the vacuum system and quickly heated to approximately 165 degrees C before the first Ag deposition was made. The layer composition was:

Hcp-CoCr$_{12}$Ta$_2$(58 nm)/Fe(37 nm)<45/O/Fe(37 nm)<45/Ag(40 nm)/sub

Where the value given in the parenthesis is the nominal film thickness in nanometers. There was an oxidation exposure step in the process. This required that after the first two film depositions the sample be briefly removed from the vacuum system. In the following table the entries are listed as (X-ray counts)/(X-ray texture)

| 99C15-19-2: CoCr$_{12}$Ta$_2$ (58 nm)/Fe (37 nm) < 45/O/Fe (37 nm) < 45/Ag (40 nm)/sub | | | |
|---|---|---|---|
| CoCr$_{12}$Ta$_2$ (58 nm)/ | Fe (37 nm)/ | Ag (40 nm) | Substrate |
| 50/(10$\bar{1}$1) | 200/(110) | 600/(111) | glass |
| 1450/(11$\bar{2}$0) | 3500/(100) | $1.6 \times 10^4$/(100) | Si (100) |
| 1600/(10$\bar{1}$0) | 1400/(112) | 9000/(110) | Si (110) |
| 600/(10$\bar{1}$1) | $1.4 \times 10^4$/(110) | $>10^5$/(111) | Si (111) |

Other than from the single crystal substrate or second order diffraction peaks there were no other diffraction peaks observed indicating the strong singular texture orientation of each layer. The textures behaved just as predicted and discussed earlier. These results confirm that bcc-d Fe grows with the same textures as Cr when deposited on a hexagonal template or each of the other single crystal textures. Since the second layer Fe would have had the same peaks as the first, the absence of any additional peaks, along with the strength of the peaks, is a good indicator that the texture, even when the second layer of Fe is grown on the oxidized surface is identical to the that of the first layer. However, since the peaks would collinear with the first film peaks there remains the question whether as to whether or not there are any second layer peaks at all. The hcp-Co alloy peaks and their strength compared to those on glass tell us that epitaxial growth of the second layer of Fe on the Fe—O was very good and provided an excellent template for the Co alloy film growth. This to confirms the texture of the second Fe layer is identical to that of the first layer of the Fe. The epitaxial growth over the oxide is confirmed for all of these textures, including the use of glass as a substrate. This later case is largely due to the excellent texture of the Ag(111) on the glass. In separated experiments the strength of the Ag(111) texture has been seen to improve several fold over the value of that directly on glass when a wetting layer of amorphous $Cr_{35}Ta$ was deposited upon the glass prior to the Ag. It also should be stated that the lattice match between Cr or Fe, which has virtually the same atomic lattice spaceing, and Ag is not particularly good. Since another hexagonal template material (fcc-d or hcp) could epitaxially grown on Ag better than the bcc-d we investigate this. Hexagonal templates of Cu, Ni, NiFe, and a combination layer fcc-Co on top of Cu, when place upon the Ag templates were all found to produce a stronger Fe or Cr texture.

To further investigate the oxide located between two different materials the following film structures were constructed:

99C15-19-3:
$CoCr_{12}Ta_2$ (58 nm)/Cr (40 nm)/O/Fe (37) < 45/Ag (40 nm)/sub

| $CoCr_{12}Ta_2$ (58 nm)/ | Cr (40 nm)/ | Fe (37 nm)/ | Ag (40 nm) | Substrate |
|---|---|---|---|---|
| 50/(10$\underline{1}$0) 25/(11$\underline{2}$0) | 50/(100) | 250/(110) | >600/(111) | glass |
| 1450/(11$\underline{2}$0) | 2900/(100) | 1900/(100) | $1.8 \times 10^4$/(100) | Si (100) |
| 75/(10$\underline{1}$0) 30/(11$\underline{2}$0) | 750/(112) | 700/(112) | $1.3 \times 10^5$/(110) | Si (110) |
| 40/(11$\underline{2}$0) | 30/(100) | 6500/(110) | $1.2 \times 10^5$/(111) | Si (111) |

From this table we can see that for Si(100) epitaxy over the oxide was excellent, however there does not appear to be much, if any, epitaxy via the oxide when Si(111) is used. It appears the the Cr epitaxy on the Fe—O was quite good for the Si(110) however the Co texture was not particularly impressive. To within experimental error the time and temperatures used to prepare this sample were the same as were used on the Fe—O—Fe samples (99C15-19-2) discussed just before this one.

The roles of Cr and Fe were interchange and the experiment repeated.

Here we see that the Cr grew highly textured on the Ag and the Fe(100) grew well on the Cr—O. However it is not clear if much of the Fe (112) grew as the peak was broad and the Cr and Fe peaks lie extremely close together and would be difficult to observe. It appears that there was some enhanced epitaxial growth of the Fe(110), but it was difficult to discern as the Cr(110) was over whelming. Nevertheless the Co (10$\underline{1}$1) peak was the only one present. In the Si(110) case the fact that any Co (10$\underline{1}$0) texture appeared is strong evidence that some of the Fe was (112) texture.

Overall we see that for the particular deposition temperature, deposition rate, and in general these particular processing conditions it was found that Fe/O/Fe epitaxially grew for all three of the Si textures. We found similar results for Cr/O/Cr. For the Cr/O/Fe/Ag/Si it appears that Cr(100) texture grew well and the Cr(112) texture grew somewhat. The Cr(110) texture did not grow well. Hence, it appears the bcc-d epitaxially grows well on the oxide of itself. Also the bcc-d (100) texture appears to grow well even on other members. The (110) and the (111) textures grow, but not as enthusiastically. We varied the processing temperature for the deposition of Ag on Si and found that the ideal temperature varied considerably with the Si orientation. The processing latitude was even more dramatic. Si(111) substrates could be processed at higher temperatures before it oxidized and this improved some of the later depositions. The Si(100) textured substrate had the next broadest process temperature range and the Si(110) substrate had the narrowest and least tolerable process temperature range. This is logical as this surface is the most unstable for an fcc Bravais lattice or for an fcc-d lattice. Each substrate texture had its own optimum temperature and temperature range and the particular temperature was dependent upon the deposition rate and humidity during the time interval just prior to placing the substrate in the vacuum system. We found the HF etched Si surface quality to be very dependent upon the environment prior to the Si reaching the vacuum system. Hence, optimizing all of the conditions simultaneously were difficult, but when it was done the results showed that epitaxial growth through the oxide on the other Si textures is significantly improved. Fortunately the (111) surface is the most stable for the hexagonal template materials and this allowed for larger latitude of temperature and deposition rate. This allows the optimization of the temperature for the oxide to be grown for each material combination.

Evidence of the six variant structures is demonstrated next. In fact, the $E_{2-a1c2}$ variant set is shown. The following film structure was made by angle of incident deposition. Two samples were prepared simultaneously, but with slightly different angles of deposition, different thicknesses, but most importantly at different angles relative to the template lattice plane direction. This was accomplished by

99C15-19-4:
$CoCr_{12}Ta_2$ (58 nm)/Fe (37 nm)/O/Cr (40) < 45/Ag (40 nm)/sub

| $CoCr_{12}Ta_2$ (58 nm) | Fe (37 nm)/ | Cr (40 nm)/ | Ag (40 nm) | Substrate |
|---|---|---|---|---|
| 35/(11$\underline{2}$0) | 25/(100) | 150/(110) | 300/(111) | glass |
| 1800/(11$\underline{2}$0) | 1600/(100) | 4000/(100) | $1.1 \times 10^4$/(100) | Si (100) |
| 60/(10$\underline{1}$0) 20/(11$\underline{2}$0) | ?/(112) | 1350/(112) | 5000/(110) | Si (110) |
| 100/(10$\underline{1}$1) | ?/(110) | $3.1 \times 10^4$/(110) | $8.5 \times 10^4$/(111) | Si (111) | mounting two substrates on the same carrier, but at different hex template angles. The deposition direction was along the <110> for sample 0909-6 and along the <112> template direction for sample 0909-5. The structure is defined here:

Sample name: 0909-6

Ag(200 nm)/Cr(40 nm)/Fe(37 nm)<45<110>/Cu(10 nm)/Ag(40 nm)/Si(111)

Sample name: 0909-5

Ag(200 nm)/Cr(40 nm)/Fe(60 nm)<55<112>/Cu(10 nm)/Ag(40 nm)/Si(111)

It should be pointed out that the Cu hexagonal template is non-magnetic and so does not provide the exchange coupling needed to cause uniaxial M-H curves. Nevertheless, it is shown below that the needed variant pair was obtained. If the Cu were replaced with fcc-Co, Ni or NiFe, or if the Ni or NiFe were deposited on top of the Fe then the coupled pair would be exchange coupled. In this example, the final thick Ag and Cr layers were applied to avoid the possibility of corrosion of the Fe after the sample was made. It was found that these layers, especially the Cr was very effective at preventing corrosion. The sample was stored for one year without obvious corrosion of the Fe. We conclude this based upon the fact that while Fe magnetic properties are very sensitive to oxidation they did not change. The protective Ag layer did discolor some.

Figure 14:
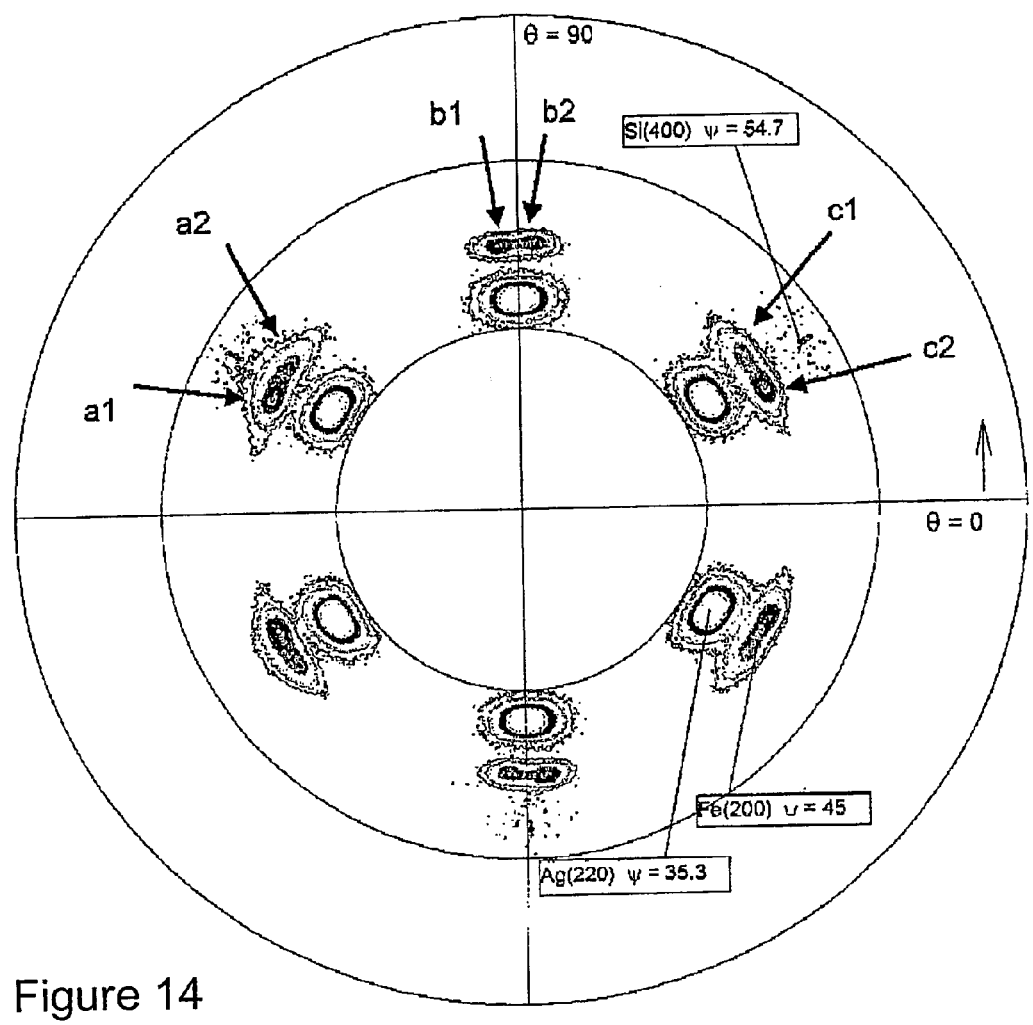
FIG. 14 is X-ray pole figure data demonstrating the existence of six bcc-d (110) textured variants with δ=5.264 where variant a1 and c2 dominate the other four variants to produce a symmetry broken structure. Also shown are the three Ag (220) peaks. The sample was produced using angle of incidence deposition.

A X-ray pole figure analysis was performed. This test allows one to rotate the sample while setting the x-ray diffraction angle to a specific reflection plane. The Fe is (110) textured so the (100) planes are tilted at 45 degrees to the surface of the film. The sample was tilted to 45 degrees and then θ–2θ was set to reflect from the (100) crystal planes. The sample was then rotated through 360 degrees and the signal was monitored. According to FIG. 3, as espoused by Gong and Zangari, if there are only three possible variants then there should be three peaks observed for each 180 degrees of rotation and they would be equally spaced at 60 degree intervals. These would repeat during the second 180 of rotation. However, if there are six variants as advocated in this invention then FIG. 5 is of relevance and six peaks would be seen per 180 degrees of rotation; and 12 would be seen during the full 360 degree rotation. If the variants are equally weighted by volume of material and the substrate were perfectly cut then all the variants of the set would be seen. We have observed both types of sets. Hence, not all samples have the potential of being represented by the energy equations associated with the six variant set. The Gong and Zangari three variant set is the most commonly observed as the energy mechanism for rotating the crystal planes and then splitting the diffraction peaks is non-trivial to accomplish. FIG. 14 shows the pole figure analysis for sample 0909-6. Careful analysis of the data shows the peak height of the a1 and the c2 variants are more than a factor of two higher than any of the other variant diffraction peaks. However, the relevant quantity of measure is the area under the peak curve and this is a very time consuming and difficult measurement, but shows a considerable larger fraction of material being in these two variants. In theory the scan should only show the Fe(100) diffraction peaks as the θ2θ angle was set specifically for this crystal plane. However there is a Ag (220) diffraction line near by and because the peak is so very strong the tails of these six peaks also show. Likewise, there is slight evidence of the very strong Si(400) peak. The angle between pairs of the six bcc-d variants was experimentally determined to be 2δ=2(5.26) degrees, as discussed at length earlier. However the angle between the peaks in the pole FIG. 14 is smaller because of the coordinate frame rotations required to go from the (110) and (100) planes. In the figure the spread between any pair of peaks should be ~2(3.74)=7.5 degrees. This is exactly what is observed. This data is strong evidence of both the six variant concepts and of the symmetry breaking mechanism. For sample 0909-5 where the deposition direction projection was the <112> direction along the hexagonal template the results were not as clearly defined. It appeared that there were again two dominant variants of the six. However they were represented by $E_{2-a1b2}$. For reference, the pole figure peaks for these variants, a1 and b2, along with the other four, are also noted on FIG. 14 while the corresponding bi-crystal energy curve for $E_{2-a1b2}$ was illustrated in FIG. 11. Clearly, even if magnetically coupled, this variant pair does not yield uniaxial behavior at all. Hence, angle of incident deposition along the <112> template direction yields and entirely different result. In summary, when deposited onto a (111) textured single crystal substrate and using angle of deposition along the directions just described as a symmetry breaking mechanism, then one set of variants yields uniaxial behavior and the other set does not. To achieve uniaxial behavior via the symmetry breaking method requires proper orientation of the template and deposition direction. However, in both orientation cases the variant symmetry was broken.

It was found that even when a hexagonal template of non-magnetic material was employed it was possible to have exchange coupled variants and to obtain the uniaxial symmetry broken behavior. Samples of structure just as described when processed at different deposition rates and temperatures yielded different grain sizes and magnetic exchange between them was possible. It was also found that deposition at an angle could result in grain morphologies, which possessed particle shape anisotropy. However, by studying the films deposited along both the <112> and <110> hexagonal template directions it was found that the symmetry breaking process and uniaxial behavior caused by the crystalline orientation still existed along with the anisotropy associated with grain shape effects. Using the proper, strongly textured and matched atomic lattice spacing, hexagonal template to induce good epitaxial growth significantly helped to minimize particle shape effects.

A similar set of experiments was conducted with a magnetic hexagonal template and an applied field. That is, rather than using the angle of incident deposition as the symmetry breaking mechanism, a magnetic field was used. Ni was used at the hexagonal template and placing permanent magnets on the substrate carrier in the vicinity of the substrates generated an applied field in the 100 Oe range. The sample structure was:

Ag(200 nm)/Cr(40 nm)/Fe(50 nm)<45/Ni(5 nm)/Ag (40 nm)/Si(111)

The resulting variant set for the case when the field was applied generally along the hexagonal template <112> direction was $E_{2-a1c2}$, whereas, if the field were applied generally along the <111> direction then one of the complement four-element variant sets with uniaxial behavior was selected. However, it was difficult to observe by x-ray pole figure measurement techniques, exactly which set of four variants dominated. Nevertheless, from the magnetic response it was determined to be one of the symmetry broken uniaxial sets. Hence, unlike the angle of incident deposition technique, when the symmetry is broken using a magnetic field mechanism, uniaxial behavior is obtain when the field is directed along either of the hexagonal template crystal directions; <110> or <112>. While the hard axis permeability, when the symmetry breaking field was along the <110> direction, which caused the four variant set to appear, should have been higher than for the two variant set it was difficult to say this was the case. The coercivity was higher and the uniaxial magnetic response function was not as ideal. These magnetic effects indicate the greater difficulty in preparing the four variant set where the processing latitude is more sever. The magnitude of the applied field varied over some of the samples prepared and very small, ~1.5 to 2 mm, size segments of the samples were studied for their individual magnetic properties. Hence, these segments represent individual samples prepared with various applied magnetic field magnitude and direction. From these measurements it was estimated that the magnetic field symmetry breaking mechanism was causing an observable degree of symmetry breaking for fields as small as 10 Oe. It should be mentioned that the applicant became concerned that the earth's magnetic field or some other stray magnetic field might be influencing the findings. The stray fields were measured in the vicinity of the substrate carrier and found to be less than or approximately one Oe, which was comparable to the measured earth's magnetic field intensity. Nevertheless, experiments were conducted where the sample substrate was mounted to a sample carrier containing the applied field magnets. Then during the deposition process the substrate carrier and, hence, the applied field magnets and sample were rotated together. This provided a constant applied field while the rotation provided an averaging mechanism for any stray applied fields. Likewise, a similar experiment was carried out with out any applied field, but employing the angle of incidence symmetry breaking technique. For both symmetry breaking techniques the magnetic results were found to be unchanged from samples prepared without the rotation process. Hence, applicant was convinced that stray fields were not playing any significant role in the experimental results.

We anticipate that achieving the four variant uniaxial results would be much easier to obtain if we had a better vacuum system and did not have to passivate the Si via H bonding from the HF-etching technique. It is well known that the silicon oxide sublimes from Si at about 850 degrees C. leaving behind a clean Si surface. If the process were preformed in an ultra high vacuum system a cleaner substrate would be available for the initial Ag deposition. We anticipate this would result in higher quality films and film structures and better control of the overall process.

Figure 15:
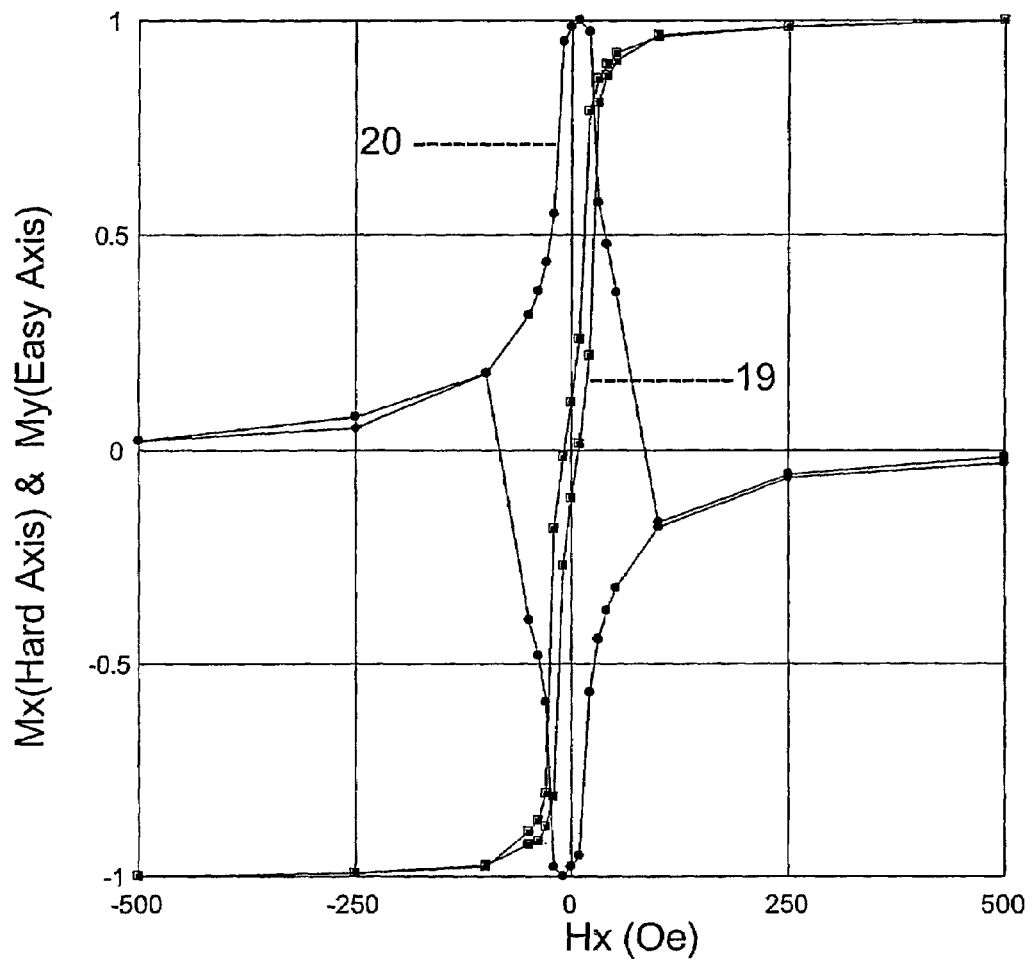
FIG. 15 shows the uniaxial magnetic hard axis response, $M_x$, function, and easy axis response function, $M_y$, data to an applied field along the hard axis, $H_x$, for an Fe ($K_1$>0) sample prepared with the easy axis along the hexagonal template <112> direction. The symmetry breaking mechanism was an applied magnetic field along the <112> direction.

Magnetic response curve measurements were made for these samples. Because the magnetic field from the permanent magnets was not perfectly uniform over the sample the symmetry breaking mechanism was not perfectly aligned with the hexagonal template <112> direction. Nevertheless, it was estimated that the field direction did not vary by more than 10 degrees over the measured sample and it was in much better alignment over the majority of the sample. This was sufficiently aligned to demonstrate the symmetry breaking mechanisms via the magnetic response curves. FIG. 15 shows the $M_x$ and $M_y$ versus $H_x$ response of one of the two variant exchange coupled, uniaxial symmetry broken samples using the structure:

Sample name: LS1425__2cx

Ag(200 nm)/Cr(40 nm)/Fe(50 nm)<H<112>/Ni(5 nm)/Ag(40 nm)/Si(111)

The coercivity of the Ni alone was measured and found to be comparable to the 10 Oe observed for the hard axis loop of this sample. Hence, it is observed that exchange coupling the film variants is not sufficient to achieve a low coercivity. The exchange coupling layer must also be magnetically soft. Permalloy, a well known soft NiFe alloy was substituted for the Ni and the coercivity was found to drop to less than 1.0 Oe. However, interestingly, even using the Ni template the sample exhibited lossless behavior if high drive fields were not used to drive the sample all the way to saturation. In a separate measurement from FIG. 15, the sample was first driven along the easy axis to remove most of the domain walls and then driven along the hard axis, but only to approximately 80% of the field needed to saturate the sample. This minor loop response showed coercivities of less than one Oe, which was approximately the resolution limit of the measurement instrument. FIG. 15 clearly shows a non-linear uniaxial type of response function when the sample was driven into saturation and uniaxial result similar to the ideal of FIG. 2. This statement applies both to the narrow hard axis loop, $M_x$, vs. $H_x$ [19] and the somewhat quadratic $M_y$, easy axis [20] response. The hard axis loop, $M_x$, illustrates the potential near linear behavior, while the $M_y$ response illustrates the non-linear response.

Other, similar composition and layer structured, samples made by angle of incident deposition showed no measurable coercivity or losses for the minor hard axis loop. In these cases permeabilities ranging from 80 to over 1000 were observed.

Hard disk media samples were prepared using a production hard disk media vacuum system, but by a similar, but less ideal than previously described, angle of incidence deposition technique. The source bcc-d material was delivered in a radial pattern over the entire disk at angles varying over the surface of the disk. This was accomplished by depositing from a standard sputtering target but by masking a large portion of the disk with a circular mask with a hole in the center. Hence, the sputtered material exited the hole at an incident angle and essentially radially. Several samples were prepared with layer constructions made as follows:

LSSDK-0505-1

Cr(40 nm)/Fe(40 nm)<~45/Cu(20 nm)/$Cr_{35}$Ta(20 nm)/glass-ceramic and

LSSDK-0505-2

CoCrPt(20 nm)/Cr(40 nm)<~45/Cu(20 nm)/$Cr_{35}$Ta (20 nm)/glass-ceramic

The magnetic properties of the first sample (Fe) exhibit anisotropic behavior with an OR of greater than one and provided confidence to proceed with sample 0505-2. The Fe was changed to Cr so as to not obscure the magnetic results of the harder CoCrPt alloy with the properties soft Fe. Of the samples prepared OR ranging from 1.05 to 1.15 were obtained when dividing the circumferential coercivity by the radial. This is as desired, and the over all coercivity was in the range of 2500 Oe. Because of the polycrystalline hexagonal template layer and the mixed amorphous and ceramic substrate has a very large interfering set of diffraction peaks no X-ray data was taken.

Those of ordinary skill in the art will appreciate that a number of modifications and variations can be made to specific aspects of the material structures, devices, method and apparatus of the present invention without departing from the scope of the present invention. Such modifications and variations are intended to be covered by the foregoing specification and the following claims.

The invention claimed is:

1. A magnetic material structure comprising:
   a substrate;
   at least one bcc-d layer which is magnetic, forming a uniaxial symmetry broken structure; and
   at least one layer providing a (111) textured hexagonal atomic template disposed between said substrate and said bcc-d layer.

2. The magnetic material structure recited in claim 1, wherein said substrate is single crystal.

3. The magnetic material structure recited in claim 1, wherein a surface of said substrate is amorphous or polycrystalline.

4. The magnetic material structure recited in claim 1, further comprising an amorphous layer on said substrate formed from an alloy of NiP, CrxTa1−x, CrxNb1−x, FexTa1−x, or FexNb1−x and 55<x<75.

5. The magnetic material structure recited in claim 4, wherein said amorphous layer is formed and the surface of the said amorphous layer is then oxidized.

6. The magnetic material structure recited in claim 1, wherein the layer providing said hexagonal atomic template is formed from a fcc-d or hcp crystalline material.

7. The magnetic material structure recited in claim 1, wherein the layer providing said hexagonal atomic template is magnetic.

8. The magnetic material structure recited in claim 1, wherein said bcc-d layer is epitaxially grown on said (111) textured hexagonal atomic template and has a (110) crystalline texture, and at least one crystalline grain of said (111) textured hexagonal atomic template has epitaxially grown thereon at least two and not more than four dominate (110) orientational variants.

9. The magnetic material structure according to claim 1, further comprising:
   a second layer providing a (111) textured hexagonal atomic template, wherein said second layer is magnetic.

10. The magnetic material structure according to claim 1, further comprising:
    a second bcc-d layer which is non-magnetic.

11. The magnetic material structure according to claim 1, further comprising:
    a second bcc-d layer which is magnetic.

12. The magnetic material structure according to claim 1, further comprising:
    a second bcc-d layer wherein the crystalline orientation of the second bcc-d layer is epitaxially determined by said bcc-d layer.

13. The magnetic material structure according to claim 1, further comprising:
    a second bcc-d layer; and
    a second layer providing a (111) textured hexagonal atomic template wherein said second layer providing a (111) textured hexagonal atomic template is disposed between said bcc-d layers.

14. The magnetic material structure according to claim 1, further comprising:
    a second bcc-d layer, which is magnetic; and
    at least one oxide layer between said bcc-d layers.

15. The magnetic material structure according to claim 1, further comprising:
    a second and a third bcc-d layers which are non-magnetic;
    a fourth bcc-d layer which is magnetic; and
    at least one oxide layer between said second bcc-d layer and said third bcc-d layer
    wherein said second and third bcc-d layers are disposed between said first and fourth bcc-d layers.

16. The magnetic material structure according to claim 1, further comprising:
    a second bcc-d layer which is magnetic;
    a second (111) textured hexagonal atomic template layer between said bcc-d layers; and
    at least one oxide layer between said bcc-d layers.

17. The magnetic material structure recited in claim 1, wherein said bcc-d layer forming a uniaxial symmetry broken structure is composed of Fe or FeCo or an alloy of Fe or FeCo.

18. The magnetic material structure recited in claim 1, wherein said bcc-d layer forming a uniaxial symmetry broken structure is composed of an alloy of Fe or FeCo having one or more of the elements Al, B, Cr, C, Cu, Ni, N, Nb, Mo, V, Si, Ta, and Ti.

19. The magnetic material structure recited in claim 1, wherein the layer material forming said (111) textured hexagonal atomic template is composed of Ag, Al, Au, Cu, fcc-Co, fcc-CoCr, Ir, Ni, NiFe, Pt, Rh, Pd, hcp-Co, Gd, Re, Ru, Tb, Ti, or alloys of one of these materials combined with at least one element.

20. The magnetic material structure according to claim 1, further comprising:
    a second bcc-d layer which is magnetic; wherein the bcc-d layers have anisotropy energy density constants of opposite sign.

21. The magnetic material structure according to claim 1, further comprising:
    a coupling layer; and
    a second bcc-d layer which is magnetic wherein the coupling layer material antiferromagnetically couples the bcc-d layers.

22. The magnetic material structure according to claim 1, further comprising:
    a second bcc-d layer which is magnetic; and
    a third bcc-d layer disposed between the bcc-d layers which are magnetic.

23. The magnetic material structure according to claim 1, further comprising:
    a second bcc-d layer which is magnetic; and
    a second (111) textured hexagonal atomic template layer wherein said second (111) textured hexagonal atomic template is disposed between said bcc-d layers.

24. The magnetic material structure according to claim 1, further comprising:
    at least one magnetic hcp Co alloy layer.

25. The magnetic material structure according to claim 1, further comprising:
    at least one magnetic hcp Co alloy layer; wherein said hcp Co alloy has a (1011) crystalline texture.

26. The magnetic material structure according to claim 1, wherein:
    said substrate is a (111) crystalline textured single crystal; and
    a surface of said single crystal provides a layer providing the (111) textured hexagonal atomic template disposed between the bulk of said substrate and said at least one bcc-d layer.

27. A magnetic device having incorporated therein a magnetic material structure comprising:
    a substrate;
    at least one bcc-d layer which is magnetic, forming a uniaxial symmetry broken structure; and
    at least one layer providing a (111) textured hexagonal atomic template disposed between said substrate and said bcc-d layer.

28. The magnetic device recited in claim 27, wherein the device is a magnetic data storage system.

29. The magnetic device recited in claim 27, wherein the device is a data storage magnetic recording transducer.

30. The magnetic device recited in claim 27, wherein the device is at least one of: an anisotropic magnetoresistive sensor; a spin valve magnetoresistive sensor; a magnetic tunnel junction magnetoresistive sensor and a data storage magnetic playback transducer.

31. The magnetic device recited in claim 27, wherein the device is at least one of: a data storage magnetic recording media; a data storage magnetic recording media incorporating an oriented soft magnetic layer; and a data storage magnetic recording media incorporating an oriented hard magnetic layer.

32. The magnetic device recited in claim 27, wherein the device is a data storage magnetic random access memory.

33. The magnetic device recited in claim 27, wherein the device is at least one of: an article surveillance tag; an article identification tag; a magnetoelastic article tag; a magnetoelastic multiple harmonic generating article tag; and a non-linear response multiple harmonic generating article tag.

34. The magnetic device recited in claim 27, wherein the device is at least one of: an electronic circuit inductive component and an electronic circuit inductive transformer component.

35. The magnetic device recited in claim 27, wherein the device is a signal mixing electronic circuit component.

36. The magnetic device recited in claim 27, wherein the device is a magnetic fluxgate sensor.

37. The magnetic device recited in claim 27, wherein the device is at least one of: an electronic spin transport digital logic circuit component and an electronic spin transport analog circuit component.

38. The magnetic device according to claim 27, further comprising:
   at least one hard magnetic layer; wherein
   said at least one bcc-d layer which is magnetic, forming a uniaxial symmetry broken structure, is disposed between said (111) textured hexagonal atomic template and said at least one hard magnetic layer.

39. The magnetic device according to claim 27, further comprising:
   at least one hard magnetic layer; wherein
   said at least one hard magnetic layer is disposed between said substrate and said at least one bcc-d layer.

40. The magnetic device according to claim 27, further comprising:
   at least one hard magnetic recording layer; wherein
   said at least one bcc-d layer, which acts as a soft magnetic keeper layer, forming a uniaxial symmetry broken structure, is disposed between said (111) textured hexagonal atomic template and said at least one hard magnetic recording layer.

41. The magnetic device according to claim 40, wherein:
   said at least one hard magnetic recording layer has a preferred magnetic orientation perpendicular to the substrate.

* * * * *

UNITED STATES PATENT AND TRADEMARK OFFICE
CERTIFICATE OF CORRECTION

| | | |
|---|---|---|
| PATENT NO. | : 7,128,988 B2 | Page 1 of 1 |
| APPLICATION NO. | : 10/415757 | |
| DATED | : October 31, 2006 | |
| INVENTOR(S) | : David N. Lambeth | |

It is certified that error appears in the above-identified patent and that said Letters Patent is hereby corrected as shown below:

Please add:

Related U.S. Application Data

(60) Provisional application No. 60/315,920, filed on Aug. 29, 2001.

Signed and Sealed this

Seventh Day of December, 2010

David J. Kappos
*Director of the United States Patent and Trademark Office*